(12) United States Patent
Lee et al.

(10) Patent No.: US 12,087,349 B2
(45) Date of Patent: Sep. 10, 2024

(54) STORAGE DEVICE AND METHOD OF DISCHARGING AN OPERATING VOLTAGE

(71) Applicant: SAMSUNG ELECTRONICS CO., LTD., Suwon-si (KR)

(72) Inventors: Kyoungeun Lee, Hwaseong-si (KR); Hyunjoon Yoo, Suwon-si (KR); Seunghan Lee, Suwon-si (KR)

(73) Assignee: Samsung Electronics Co., Ltd. (KR)

(*) Notice: Subject to any disclaimer, the term of this patent is extended or adjusted under 35 U.S.C. 154(b) by 79 days.

(21) Appl. No.: 17/862,472

(22) Filed: Jul. 12, 2022

(65) Prior Publication Data

US 2023/0121875 A1 Apr. 20, 2023

(30) Foreign Application Priority Data

Oct. 15, 2021 (KR) .................. 10-2021-0137305

(51) Int. Cl.
| | |
|---|---|
| *G11C 5/14* | (2006.01) |
| *G11C 11/4074* | (2006.01) |
| *G11C 11/4099* | (2006.01) |
| *G11C 16/30* | (2006.01) |
| *H03K 19/20* | (2006.01) |

(52) U.S. Cl.
CPC .......... *G11C 11/4074* (2013.01); *G11C 5/147* (2013.01); *G11C 11/4099* (2013.01); *G11C 16/30* (2013.01); *H03K 19/20* (2013.01); *G11C 5/145* (2013.01)

(58) Field of Classification Search
CPC ..... G11C 11/4074; G11C 5/147; G11C 16/30; H03K 19/20; G06F 1/26
See application file for complete search history.

(56) References Cited

U.S. PATENT DOCUMENTS

| | | |
|---|---|---|
| 7,154,789 B2 | 12/2006 | Kim et al. |
| 7,250,811 B2 | 7/2007 | Kim |
| 7,679,133 B2 | 3/2010 | Son et al. |
| 7,679,412 B2 | 3/2010 | Ogiwara et al. |
| 8,553,466 B2 | 10/2013 | Han et al. |
| 8,559,235 B2 | 10/2013 | Yoon et al. |
| 8,654,587 B2 | 2/2014 | Yoon et al. |
| 9,164,562 B2 | 10/2015 | Shim |
| 9,190,120 B2 | 11/2015 | Shim et al. |
| 9,373,366 B2 | 6/2016 | Son |
| 9,985,519 B2 | 5/2018 | Suzuki et al. |

(Continued)

*Primary Examiner* — Mushfique Siddique
(74) *Attorney, Agent, or Firm* — Fish & Richardson P.C.

(57) ABSTRACT

A storage device includes: a controller that exchanges data with a host through an interface; memory devices that store the data; a power supply circuit that outputs internal voltages, required for the controller and the memory devices, using an external voltage received through the interface; a distribution circuit that provides an operating voltage to the memory devices; and a discharge circuit including a first comparator that compares a first internal voltage, among the internal voltages, with a reference voltage and a second comparator that compares a second internal voltage, different from the first internal voltage, with the reference voltage, and including an operating circuit that computes an output of the first comparator and an output of the second comparator to output a discharge control signal determining whether the operating voltage has been discharged.

17 Claims, 24 Drawing Sheets

(56) References Cited

U.S. PATENT DOCUMENTS

| | | |
|---|---|---|
| 10,102,916 B1 | 10/2018 | Kao et al. |
| 10,340,008 B2 | 7/2019 | Kawamura et al. |
| 10,650,865 B2 | 5/2020 | Lee |
| 2008/0219073 A1* | 9/2008 | Kang ............... G11C 7/08 365/189.11 |
| 2009/0051418 A1* | 2/2009 | Gogl ............... G11C 5/025 327/540 |
| 2011/0233648 A1 | 9/2011 | Seol et al. |
| 2016/0133302 A1* | 5/2016 | Son ............... G11C 5/148 365/226 |
| 2017/0062056 A1 | 3/2017 | Park et al. |
| 2019/0227611 A1* | 7/2019 | Nam ............... G06F 1/3296 |
| 2019/0279687 A1* | 9/2019 | Lee ............... H03K 5/24 |

\* cited by examiner

| $V_{BIAS}$ | $V_{EN}$ | $V_{IN}$ | $V_{OUT1}$ / $V_{OUT2}$ | DISCHARGE CONTROL SIGNAL |
|---|---|---|---|---|
| L | L | L | L / L | L |
| L | L | H | L / H | H |
| L | H | L | L / L | L |
| L | H | H | L / H | H |
| H | L | L | H / L | H |
| H | L | H | H / L | H |
| H | H | L | L / L | L |
| H | H | H | L / L | L |

FIG. 8

| $V_{BIAS}$ | $V_{EN}$ | $V_{IN}$ | $V_{OUT1}$ | DISCHARGE CONTROL SIGNAL |
|---|---|---|---|---|
| | | | $V_{OUT2}$ | |
| L | L | L | H | H |
| | | | H | |
| L | L | H | H | H |
| | | | H | |
| L | H | L | L | H |
| | | | H | |
| L | H | H | L | H |
| | | | H | |
| H | L | L | H | H |
| | | | L | |
| H | L | H | H | H |
| | | | L | |
| H | H | L | L | L |
| | | | L | |
| H | H | H | L | L |
| | | | L | |

| | C17 | C18 | C19 | C20 | C21 | C22 | C23 | C24 | C25 | C26 | C27 | C28 | C29 | C30 | C31 | C32 |
|---|---|---|---|---|---|---|---|---|---|---|---|---|---|---|---|---|
| $V_{BIAS}$ | $V_{REF}$ (waveform) | | | | | | | | | | | | | | | |
| $V_{EN}$ | $V_{REF}$ (waveform) | | | | | | | | | | | | | | | |
| $V_{IN}$ | $V_{REF}$ (waveform) | | | | | | | | | | | | | | | |
| $V_{OP}$ | $V_{REF}$ (waveform) | | | | | | | | | | | | | | | |
| DISCHARGE REQUIRED | X | X | O | O | X | X | O | O | X | X | O | X | X | X | O | X |
| FIRST COMPARATOR | – | – | – | – | H | H | – | – | H | L | H | L | L | H | H | L |
| SECOND COMPARATOR | – | – | – | H | H | H | H | H | – | – | – | – | L | L | L | L |
| THIRD COMPARATOR | H | H | H | H | H | H | H | H | L | L | L | L | L | L | L | L |
| DISCHARGE CONTROL SIGNAL | H | H | H | H | H | H | H | H | H | L | H | L | L | H | H | L |

| | C1 | | C2 | | C3 | | C4 | | C5 | | C6 | | C7 | | C8 | |
|---|---|---|---|---|---|---|---|---|---|---|---|---|---|---|---|---|
| $V_{BIAS}$ | \multicolumn{16}{|c|}{waveform with $V_{REF}$} |
| $V_{EN}$ | \multicolumn{16}{|c|}{waveform with $V_{REF}$} |
| $V_{IN}$ | \multicolumn{16}{|c|}{$V_{REF}$} |
| $V_{OP}$ | \multicolumn{16}{|c|}{$V_{REF}$} |
| DISCHARGE REQUIRED | X | X | X | X | O | O | O | O | X | X | X | X | O | O | O | O |
| FIRST COMPARATOR | H | – | H | H | – | – | H | H | H | – | – | H | H | – | – | H |
| SECOND COMPARATOR | H | L | L | H | H | L | L | H | H | L | L | H | H | L | L | – |
| THIRD COMPARATOR | – | H | H | – | H | H | H | – | – | H | H | – | – | H | H | H |
| DISCHARGE CONTROL SIGNAL | H | H | H | H | H | H | H | H | H | H | H | H | H | H | H | H |

FIG. 17

| | C9 | | C10 | | C11 | | C12 | | C13 | | C14 | | C15 | | C16 | |
|---|---|---|---|---|---|---|---|---|---|---|---|---|---|---|---|---|
| $V_{BIAS}$ | | | | | | | | | | | | | | | | |
| $V_{EN}$ | | | | | | | | | | | | | | | | |
| $V_{IN}$ | | | | | | | | | | | | | | | | |
| $V_{OP}$ | | | | | | | | | | | | | | | | |
| DISCHARGE REQUIRED | X | X | X | X | X | O | O | X | X | X | X | X | X | O | O | X |
| FIRST COMPARATOR | L | – | H | – | L | – | – | L | L | – | – | L | L | – | – | L |
| SECOND COMPARATOR | L | H | H | H | L | H | H | L | L | H | H | L | L | H | H | L |
| THIRD COMPARATOR | L | – | H | – | L | – | – | L | L | – | – | L | L | – | – | L |
| DISCHARGE CONTROL SIGNAL | L | H | H | H | L | H | H | L | L | H | H | L | L | H | H | L |

FIG. 18

| | C17 | C18 | C19 | C20 | C21 | C22 | C23 | C24 | C25 | C26 | C27 | C28 | C29 | C30 | C31 | C32 |
|---|---|---|---|---|---|---|---|---|---|---|---|---|---|---|---|---|
| $V_{BIAS}$ | $V_{REF}$ | | | | | | | | | | | | | | | |
| $V_{EN}$ | | $V_{REF}$ | | | | | | | | | | | | | | |
| $V_{IN}$ | | | $V_{REF}$ | | | | | | | | | | | | | |
| $V_{OP}$ | | | | $V_{REF}$ | | | | | | | | | | | | |
| DISCHARGE REQUIRED | X | X | O | O | X | X | O | O | X | X | O | X | X | X | O | X |
| FIRST COMPARATOR | – | – | – | – | – | – | – | – | H | L | H | L | H | L | H | L |
| SECOND COMPARATOR | H | H | H | H | H | H | H | H | H | L | H | L | H | L | H | L |
| THIRD COMPARATOR | – | – | – | H | – | H | – | H | – | L | – | L | – | L | – | L |
| DISCHARGE CONTROL SIGNAL | H | H | H | H | H | H | H | H | H | L | H | L | H | L | H | L |

FIG. 19

| | C9 | C10 | C11 | C12 | C13 | C14 | C15 | C16 |
|---|---|---|---|---|---|---|---|---|
| $V_{BIAS}$ | | | | | | | | |
| $V_{EN}$ | | | | | | | | |
| $V_{IN}$ | | | | | | | | |
| $V_{OP}$ | | | | | | | | |
| DISCHARGE REQUIRED | X | X | X | O | O | X | X | X | X | X | X | O | O | X | X | X |
| FIRST COMPARATOR | L | H | L | L | H | H | H | H | L | L | L | L | H | H | L | L |
| SECOND COMPARATOR | L | H | L | L | H | H | H | H | L | L | L | L | H | H | L | L |
| THIRD COMPARATOR | — | — | — | — | — | — | — | — | L | L | L | L | H | H | L | L |
| DISCHARGE CONTROL SIGNAL | L | H | L | L | H | H | H | H | L | L | L | L | H | H | L | L |

FIG. 22

| | C17 | C18 | C19 | C20 | C21 | C22 | C23 | C24 | C25 | C26 | C27 | C28 | C29 | C30 | C31 | C32 |
|---|---|---|---|---|---|---|---|---|---|---|---|---|---|---|---|---|
| $V_{BIAS}$ | | | | | | | | | | | | | | | | |
| $V_{EN}$ | $V_{REF}$ | | | | | | | | | | | | | | | |
| $V_{IN}$ | $V_{REF}$ | | | | | | | | | | | | | | | |
| $V_{OP}$ | $V_{REF}$ | | | | | | | | | | | | | | | |
| DISCHARGE REQUIRED | X | X | O | O | X | X | O | O | X | X | O | X | X | X | O | X |
| FIRST COMPARATOR | H | L | H | L | H | H | H | L | H | L | H | L | H | L | H | L |
| SECOND COMPARATOR | H | H | H | H | H | H | H | H | L | L | L | L | L | L | L | L |
| THIRD COMPARATOR | – | – | – | – | H | H | H | H | – | – | – | – | L | L | L | L |
| DISCHARGE CONTROL SIGNAL | H | H | H | H | H | H | H | H | H | L | H | H | H | L | H | L |

FIG. 23

STORAGE DEVICE AND METHOD OF DISCHARGING AN OPERATING VOLTAGE

CROSS-REFERENCE TO RELATED APPLICATION(S)

This application claims benefit of priority to Korean Patent Application No. 10-2021-0137305 filed on Oct. 15, 2021, in the Korean Intellectual Property Office, the disclosure of which is incorporated herein by reference in its entirety.

BACKGROUND

The present disclosure relates to a storage device and an electronic device.

A storage device is a device connected to an external host to exchange data therewith and may include a controller, a memory device storing data, and a power supply circuit. The power supply circuit may generate a voltage, required to operate the controller and the memory device, using a voltage provided from the external host through an interface to stably operate the storage device. In the situation in which power is turned off for a short amount of time and is then turned on again, operational stability of the controller and the memory device may be deteriorated unless a voltage output by the power supply circuit is rapidly discharged.

SUMMARY

Example embodiments provide a storage device and an electronic device which may rapidly and stably discharge an operating voltage, output by a voltage circuit under various situations and divided by a controller, a memory device, or the like, to improve operational stability.

According to an example embodiment, a storage device includes: a controller configured to exchange data with an external host through an interface; a plurality of memory devices configured to store the data; a power supply circuit configured to output internal voltages, required for the controller and the plurality of memory devices, using an external voltage received through the interface; a distribution circuit connected between the controller and the power supply circuit and between the plurality of memory devices and the power supply circuit and configured to provide an operating voltage to the plurality of memory devices; and a discharge circuit including a first comparator, comparing a first internal voltage, among the internal voltages, with a reference voltage and a second comparator, comparing a second internal voltage, different from the first internal voltage, with the reference voltage, and including an operational circuit computing an output of the first comparator and an output of the second comparator to output a discharge control signal determining whether the operating voltage has been discharged.

According to an example embodiment, a storage device includes: a controller configured to exchange data with an external host through an interface; a plurality of memory devices configured to store the data; a power supply circuit configured to receive an external voltage from the external host through the interface and to output an operating voltage, required to operate the controller and the plurality of memory devices, and a plurality of internal voltages; and a discharge circuit connected between the power supply circuit and at least one of the controller and the plurality of memory devices and configured to output a discharge control signal controlling discharging of the operating voltage. The discharge circuit outputs the discharge control signal based on an output of each of a first comparator and a second comparator, and the first comparator and the second comparator operate independently of each other. The first comparator compares a first internal voltage, among the internal voltages, with a reference voltage. The second comparator compares a second internal voltage, different from the first internal voltage, with the reference voltage.

According to an example embodiment, an electronic device includes: a power supply circuit configured to receive an external voltage through an interface and to output a plurality of internal voltages using the external voltage; a distribution circuit configured to divide the plurality of internal voltages and to output the divided internal voltages to a plurality of semiconductor devices; and a discharge circuit connected between at least one of the plurality of semiconductor devices and the power supply circuit and including a first comparator comparing one of the plurality of internal voltages with a reference voltage to output a first comparison signal, a second comparator comparing another one of the plurality of internal voltages with the reference voltage to output a second comparison signal, and a logic circuit performing an OR operation on the first comparison signal and the second comparison signal. At least one of a first power supply voltage provided to the first comparator and a second power supply voltage provided to the second comparator is the external voltage or a voltage generated by dividing the external voltage.

BRIEF DESCRIPTION OF DRAWINGS

The above and other aspects, features, and advantages of the present disclosure will be more clearly understood from the following detailed description, taken in conjunction with the accompanying drawings.

FIG. 8 is a diagram illustrating an operation of the discharge circuit according to an example embodiment illustrated in FIG. 7.

FIG. 11 is a diagram illustrating an operation of the discharge circuit according to an example embodiment illustrated in FIG. 10.

FIGS. 13 to 15 are diagrams illustrating an operation of the discharge circuit according to an example embodiment illustrated in FIG. 12.

FIGS. 17 to 19 are diagrams illustrating an operation of the discharge circuit according to an example embodiment illustrated in FIG. 16.

FIGS. 21 to 23 are diagrams illustrating an operation of the discharge circuit according to an example embodiment illustrated in FIG. 20.

DETAILED DESCRIPTION

Hereinafter, example embodiments will be described with reference to the accompanying drawings.

Figure 1:
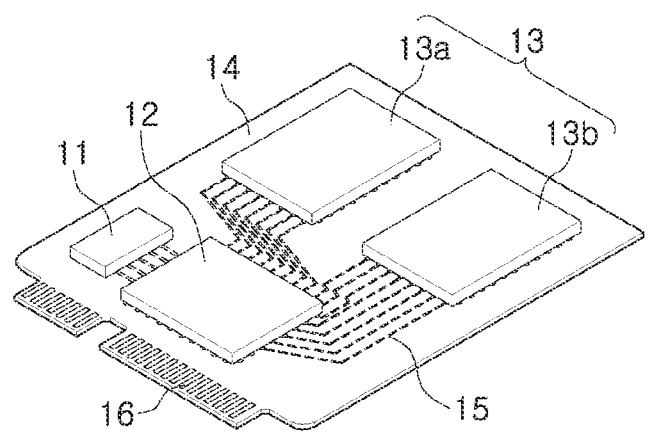
FIGS. 1 and 2 are schematic diagrams illustrating storage devices according to an example embodiment.
Figure 2:
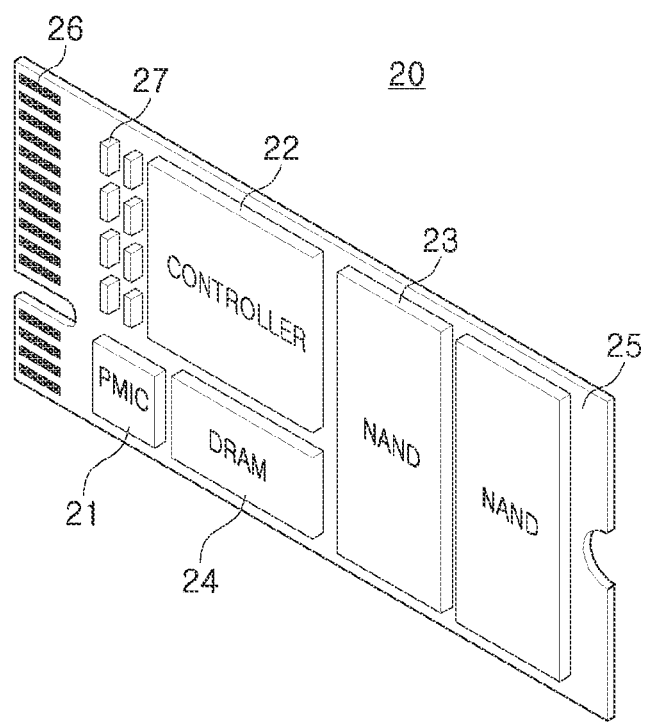

FIGS. 1 and 2 are schematic diagrams illustrating storage devices according to an example embodiment.

In the example embodiments described with reference to FIGS. 1 and 2, storage devices 10 and 20 may each be a solid-state drive (SSD) device. Referring to FIG. 1, the storage device 10 according to an example embodiment may include a power supply circuit 11, a controller 12, a plurality of memory devices 13a to 13b (generically denoted by a reference numeral "13"), and the like. The power supply circuit 11, the controller 12, and the memory devices 13 may be connected to each other by interconnection patterns 15 formed on the system substrate 14.

The system substrate 14 may include a connector 16 including a plurality of pins coupled to an external host. The number and arrangement of the plurality of pins, included in the connector 16, may vary depending on a communication interface between the storage device 10 and the external host. In example embodiments, the storage device 10 may communicate with the external host through an interface, among M-PHY interfaces for Universal Serial Bus (USB), Peripheral Component Interconnect Express (PCI-Express), Serial Advanced Technology Attachment (SATA), Universal Flash Storage (UFS), and the like. As an example, the storage device 10 according to the example embodiment illustrated in FIG. 1 may have a form factor such as a 2.5-inch disk drive and may communicate with other external devices according to a SATA protocol.

The storage device 10 may operate with power supplied from an external host through the connector 16. The power supply circuit 11 of the storage device 10 may be a power management integrated circuit (PMIC) generating internal voltages, required to operate the controller 12 and the memory devices 13, using the external voltage provided by the external host through the connector 16. In some embodiments, the storage device 10 may further include a distribution circuit dividing the internal voltages, generated by the power supply circuit 11, to generate and transmit an operating voltage to the controller 12 and the memory devices 13.

The controller 12 may write data to the memory devices 13 or may read data from the memory packages 13. In addition, the controller 12 may exchange data with the external host. The memory devices 13 may include a first memory device 13a and a second memory device 13b separated from each other, and each of the first and second memory devices 13a and 13b may include one or more memory chips. The memory chips may be NAND memory chips, and the controller 12 may include a NAND controller controlling the NAND memory chips, a memory interface, and the like.

Referring to FIG. 2, the storage device 20 according to an example embodiment may have an M.2 standard form factor and may communicate with an external host, such as a central processing unit, a system-on-chip, an application processor, or the like, according to a PCI-Express protocol.

The storage device 20 may include a power supply circuit 21, a controller 22, memory devices 23, a dynamic random access memory (DRAM) 24, a system substrate 25, and the like. Configurations and operations of the power supply circuit 21, the controller 22, and the memory devices 23 may be similar to those described above with reference to FIG. 1.

The DRAM 24 may be a buffer memory reducing a difference in speed between the memory devices 23, serving as a data storage space, and an external host. The DRAM 24 included in the storage device 20 may operate as a type of cache memory and may provide a space in which data is temporarily stored during a control operation for the memory devices 23. The controller 22 may further include a DRAM controller controlling the DRAM 24, in addition to the NAND controller controlling the memory devices 23 including NAND memory chips.

The system substrate 25 may include a connector 26 for connection to an external host and at least one integrated circuit 27 may be further mounted on the system substrate 25. As an example, the integrated circuits 27 may include a distribution circuit dividing internal voltages, generated by the power supply circuit 21, and transmitting the divided voltages to the controller 22, the memory devices 23, the DRAM 24, and the like. The distribution circuit may be implemented as a package, independent of the power supply circuit 21.

In each of the storage devices 10 and 20 according to the example embodiments described with reference to FIGS. 1 and 2, an additional discharge circuit may be connected to an output terminal of each of the power supply circuits 11 and 21. The discharge circuit may be provided as a package, independent of the power supply circuits 11 and 21 as well as the distribution circuit, and may detect levels of internal voltages, generated using an external voltage received from the external host by the power supply circuits 11 and 21, to determine whether an operating voltage provided to the controllers 12 and 22, the memory devices 13 and 23, the DRAM 24, or the like, has been discharged. However, according to example embodiments, at least some of the distribution circuit, the discharge circuit, and the power supply circuits 11 and 21 may be included in a single package.

Figure 3:
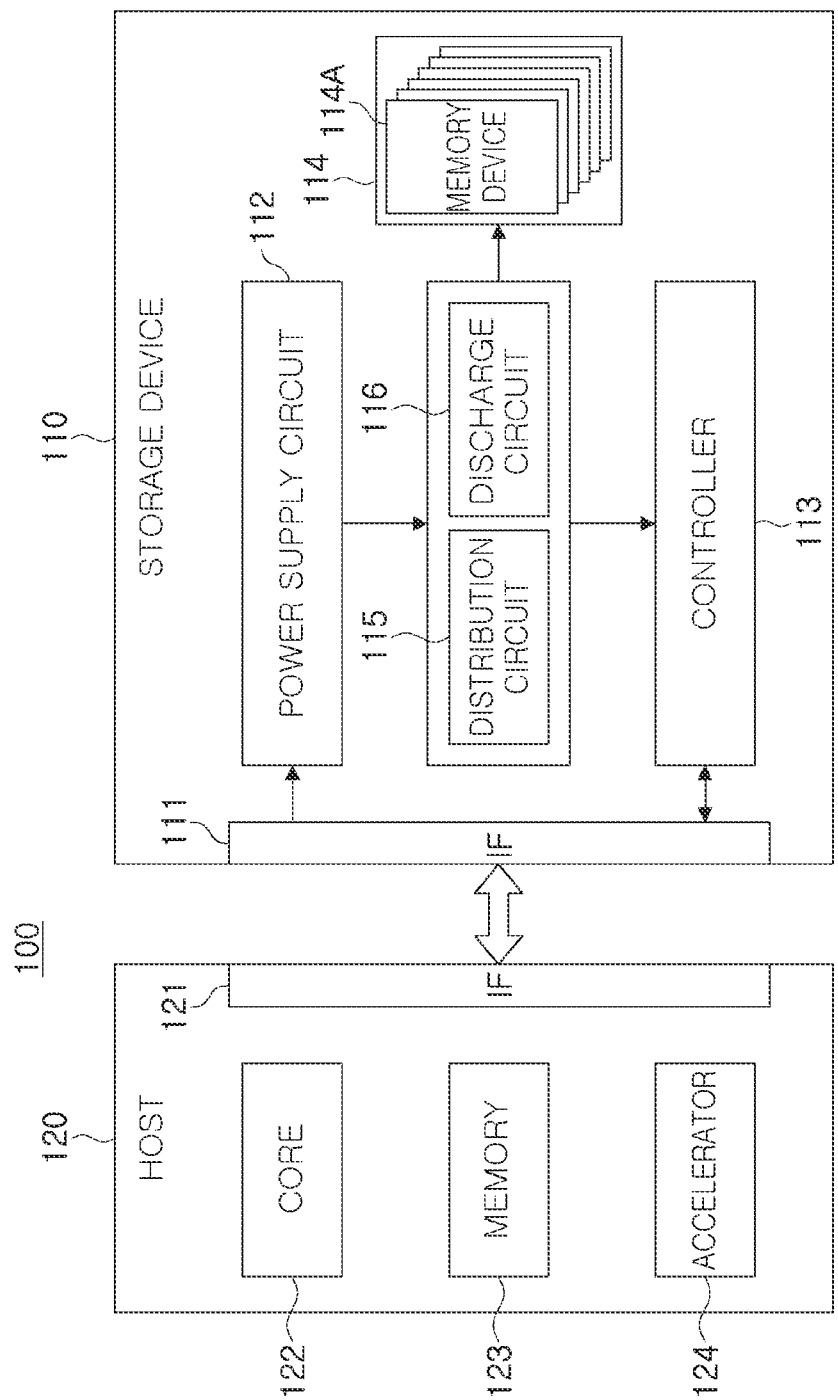
FIGS. 3 and 4 are schematic block diagrams illustrating a system including a storage device according to an example embodiment.
Figure 4:
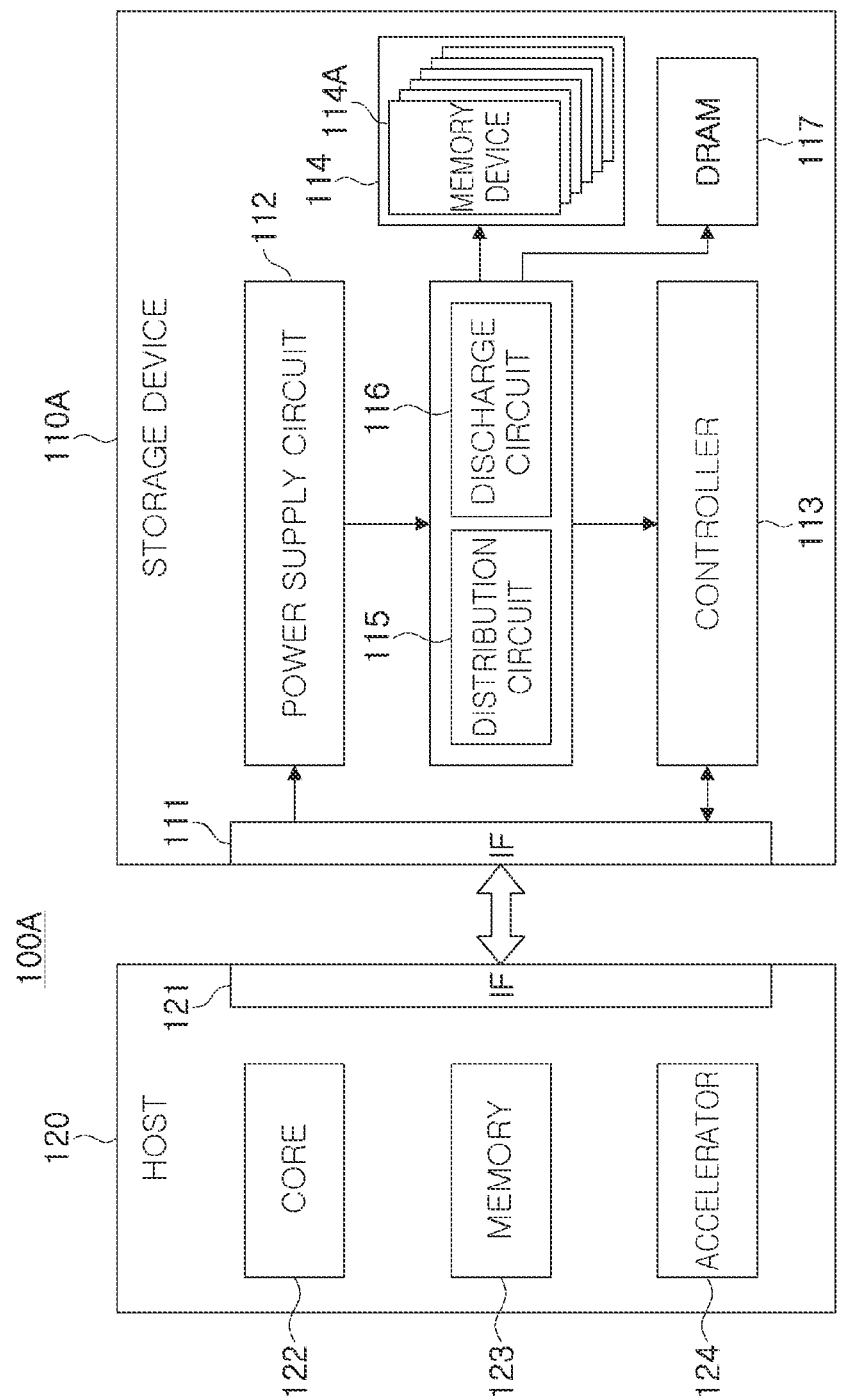

FIGS. 3 and 4 are schematic block diagrams illustrating a system including a storage device according to an example embodiment.

Referring to FIG. 3, a system 100 according to an example embodiment may include a storage device 110 and a host 120. The host 120 may control the storage device 110 to store data in the storage device 110 or to read data stored in the storage device 110. The host 120 may be one of devices such as a central processing unit (CPU), an application processor (AP), a system-on-chip (SoC), and the like.

The host 120 may include an interface 121 connected to the storage device 110, a core 122 performing a main operation, a memory 123, an accelerator 124, and the like. According to an example embodiment, the host 120 may include two or more cores 122, and the memory 123 may be a cache memory inside the host 120. The accelerator 124 may perform artificial intelligence (AI) data calculation, and the like.

The storage device 110 may include an interface 111, a power supply circuit 112, a controller 113, a memory package 114, a distribution circuit 115, and a discharge circuit 116. The storage device 110 may receive a control command from the host 120 through the interface 111. The storage device 110 may receive data and may store the received data in the memory package 114 or may fetch data stored in the memory package 114 and may output the fetched data to the host 120. The control command may include address information, and the controller 113 may store data in at least one of the plurality of memory devices 114A, included in the memory package 114, based on the address information or may read data from at least one of the plurality of memory devices 114A.

The storage device 110 may receive an external voltage required for operation from the host 120 through the interface 111. The external voltage received through the interface 111 may be input to the power supply circuit 112, and the power supply circuit 112 may output a plurality of internal voltages using the external voltage. A plurality of internal voltages generated by the power supply circuit 112 may be output to the distribution circuit 115, and the distribution circuit 115 may output an operating voltage to the controller 113 and the memory package 114 using the plurality of internal voltages.

Similar to the distribution circuit 115, the discharge circuit 116 may receive internal voltages of the power supply circuit 112. However, the discharge circuit 116 may not output an additional operating voltage to the distribution circuit 115 and may discharge the operating voltage, output to the controller 113 and the memory package 114 by the distribution circuit 115, in the case in which power should be rapidly cut off. As an example, the discharging circuit 116 may turn on a switching device, connected between an output terminal and a ground terminal of the distribution circuit 115, to discharge an operating voltage in the case power should be rapidly cut off.

Referring to FIG. 4, a system 100A may include a storage device 110A and a host 120, and the storage device 110A may include an interface 111, a power supply circuit 112, a controller 113, a memory package 114, a distribution circuit 115, a discharge circuit 116, and a DRAM 117. In an example embodiment, the DRAM 117 may operate as a buffer memory for increasing speed in an operation in which the controller 113 exchanges data, stored in the memory package 114, with the host 120.

Similar to the controller 113 and the memory package 114, the DRAM 117 may receive an operating voltage generated by the power supply circuit 112 through the distribution circuit 115. In the case power should be rapidly cut off, for example, in the case of a sudden power-off recovery (SPOR), the discharge circuit 116 may rapidly discharge the operating voltage provided to the DRAM 117.

Figure 5:
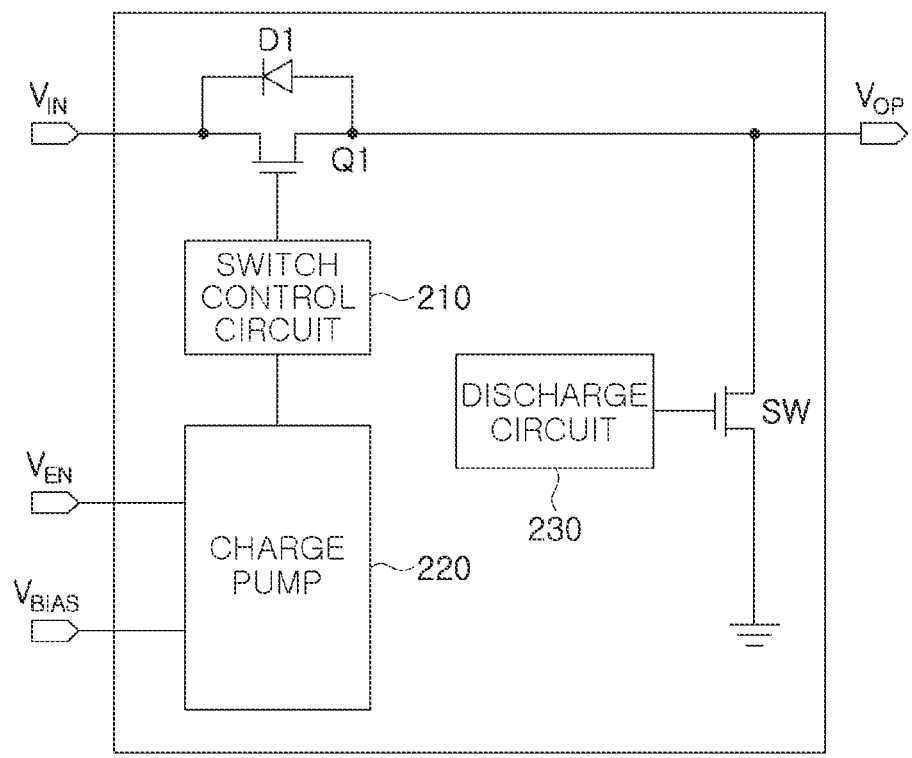
FIGS. 5 and 6 are diagrams illustrating a distribution circuit included in a storage device according to an example embodiment.
Figure 6:
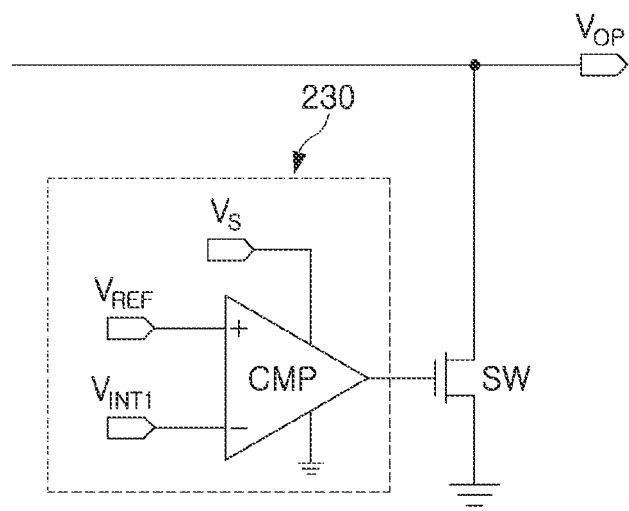

FIGS. 5 and 6 are diagrams illustrating a dividing circuit included in a storage device according to an example embodiment.

Referring to FIG. 5, a distribution circuit 200 may receive a plurality of internal voltages $V_{IN}$, $V_{EN}$, and $V_{BIAS}$, generated by a power supply circuit of a storage device, to output an operating voltage $V_{OP}$. As an example, the operating voltage $V_{OP}$ may be a type of power supply voltage provided to a controller and memory devices included in the storage device.

In an example embodiment, the distribution circuit 200 may be implemented as a load switching circuit. The distribution circuit 200 may be connected between the power supply circuit and the controller, a load of the power supply circuit, and the memory devices and may protect the controller and the memory devices in response to changes in a temperature, a voltage, current, and the like or may rapidly discharge the operating voltage $V_{OP}$ in the case in which power needs to be rapidly cut off.

The distribution circuit 200 may include a load switch Q1, a diode D1, a switch control circuit 210, a charge pump 220, a discharge circuit 230, and an output switch SW. The load switch Q1 may be connected between the input voltage $V_{IN}$ and the operating voltage $V_{OP}$, and the input voltage $V_{IN}$ may be provided to the controller and the memory devices as the operating voltage $V_{OP}$ when the load switch Q1 is turned on. The diode D1 may be connected to the load switch Q1 and may block current flowing in a reverse direction.

The switch control circuit 210 may include a driver connected to a gate, a control terminal of the load switch Q1, and may control ON or OFF switching of the load switch Q1. The charge pump 220 may operate with the bias voltage $V_{BIAS}$ and the enable voltage $V_{EN}$ and may generate and provide a voltage required to operate the switch control circuit 210.

As illustrated in FIG. 5, the distribution circuit 200 may include an output switch SW and a discharge circuit 230 which rapidly discharge a supply voltage $V_{OP}$, an output, under a specific condition. The output switch SW may be connected between a ground terminal and an output terminal to which the supply voltage $V_{OP}$ is output, and the discharge circuit 230 may control ON or OFF switching of the output switch SW. Hereinafter, the operation of the discharge circuit 230 will be described in greater detail with reference to FIG. 6.

Referring to FIG. 6, the discharge circuit may include a comparator CMP. The comparator CMP may operate with a predetermined power supply voltage Vs and may compare a reference voltage $V_{REF}$ and a first internal voltage $V_{INT1}$. Since the discharge circuit 230 is included in the distribution circuit 200, the first internal voltage $V_{INT1}$ compared with the reference voltage $V_{REF}$ as well as the power supply voltage Vs provided to the comparator CMP may be selected as one of the input voltage $V_{IN}$, the bias voltage $V_{BIAS}$, and the enable voltage $V_{EN}$.

In an example embodiment, the power supply voltage Vs may be the bias voltage $V_{BIAS}$ and the first internal voltage $V_{INT1}$ may be an enable voltage $V_{EN}$. Accordingly, the comparator CMP of the discharge circuit 230 may turn on the output switch SW when the enable voltage $V_{EN}$ is decreased to be lower than the reference voltage $V_{REF}$. For example, when the enable voltage $V_{EN}$ is decreased to be lower than the reference voltage $V_{REF}$, the output switch SW may be turned on the discharge circuit 230 to rapidly discharge the operating voltage.

However, such an operation may be performed under the assumption that the power supply voltage Vs, at which the comparator CMP may normally operate, is provided. As an example, when the bias voltage $V_{BIAS}$ provided as the power supply voltage Vs is decreased to a level at which the comparator CMP may not normally operate, the output switch SW may not be turned on by the comparator CMP. Accordingly, the operating voltage VOP may be continuously output in the case in which the operating voltage VOP needs to be rapidly discharged. As a result, operational stability of the storage device may be deteriorated.

In an example embodiment, independently of the distribution circuit 200, the discharge circuit may be connected between the controller and the memory devices and the power supply circuit to improve the operational stability of the storage device. The discharge circuit according to an example embodiment may include two or more comparators and may compare two or more internal voltages, among the internal voltages $V_{IN}$, $V_{EN}$, and $V_{BIAS}$, with a reference voltage to determine whether the output switch SW is turned on. In addition, each of the two or more comparators may operate with different voltages, among the internal voltages $V_{IN}$, $V_{EN}$, and $V_{BIAS}$, or may operate with an external voltage input to the power supply circuit. Accordingly, the output switch SW may be rapidly turned in the case in which the operating voltage VOP needs to be rapidly discharged and the operational stability of the storage device may be improved.

Figure 7:
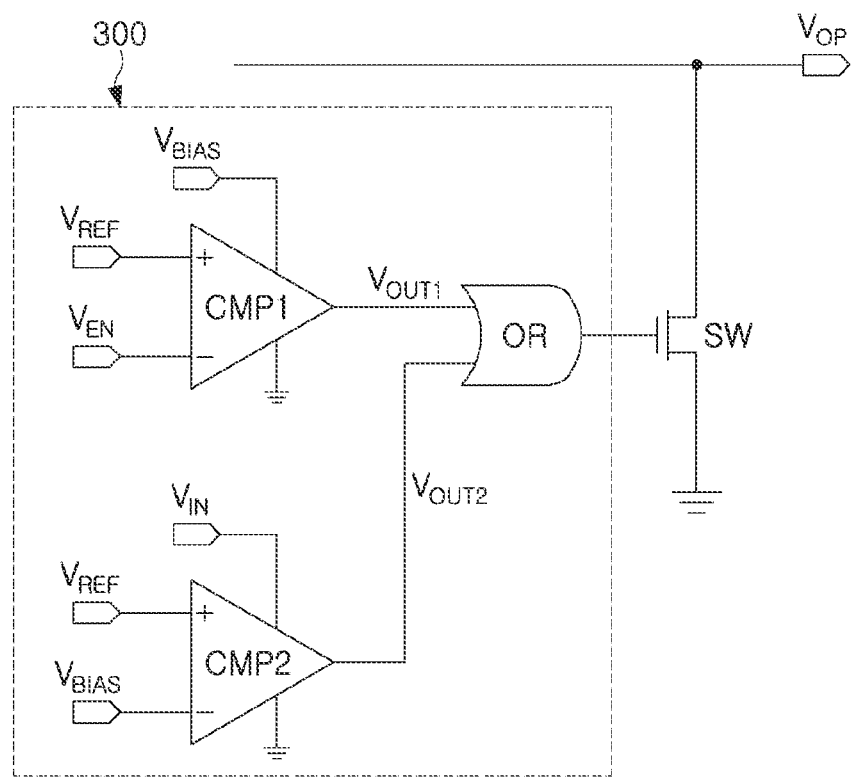
FIG. 7 is a diagram illustrating a discharge circuit included in a storage device according to an example embodiment.

FIG. 7 is a diagram illustrating a discharge circuit included in a storage device according to an example embodiment.

Referring to FIG. 7, a discharge circuit 300 according to an example embodiment may include a first comparator CMP1 and a second comparator CMP2. The first comparator CMP1 may compare an enable voltage $V_{EN}$, corresponding to a first internal voltage, with a reference voltage $V_{REF}$, and the second comparator CMP2 may compare a bias voltage $V_{BIAS}$, corresponding to a second internal voltage, with the reference voltage $V_{REF}$. Each of the first and second comparators CMP1 and CMP2 may receive the reference voltage $V_{REF}$ through a non-inverting input terminal thereof.

ON or OFF switching of the output switch, included in the distribution circuit, may be determined by a first comparison signal $V_{OUT1}$, output by the first comparator CMP1, and/or a second comparison signal $V_{OUT2}$ output by the second comparator CMP2. As an example, the discharge circuit 300 may include an OR gate "OR" performing an OR operation on the first comparison signal $V_{OUT1}$ and the second comparison signal $V_{OUT2}$. The OR gate "OR" may output a discharge control signal to a control terminal of the output switch SW. However, according to example embodiments, the discharge circuit 300 may include an operational circuit, different from the OR gate "OR."

As an example, when at least one of the first comparison signal $V_{OUT1}$ and the second comparison signal $V_{OUT2}$ has a voltage level corresponding to a logic high level, the OR gate "OR" may turn on the output switch SW to rapidly discharge the operating voltage $V_{OP}$ output from the distribution circuit. The discharge circuit 300 including the plurality of comparators CMP1 and CMP2 may compare two or more internal voltages, among internal voltages supplied to the distribution circuit, with the reference voltage $V_{REF}$ to determine whether the operating voltage $V_{OP}$ has been discharged, so that stability of the storage device including the discharge circuit 300 may be improved.

In an example embodiment, a power supply voltage input to the first comparator CMP1 and a power supply voltage provided to the second comparator CMP2 may be different from each other. Referring to FIG. 7, a bias voltage $V_{BIAS}$, a second internal voltage, may be provided to the first comparator CMP1 as a power supply voltage, and an input voltage $V_{IN}$, a third internal voltage, may be provided to the second comparator CMP2 as a power supply voltage. Accordingly, as described above with reference to FIG. 6, even in the case in which the discharge circuit included in the distribution circuit may not normally operate, the output switch SW may be turned on by the discharge circuit 300 to rapidly discharge the operating voltage $V_{OP}$.

In the example embodiment illustrated in FIG. 7, an output of the first comparator CMP1 may not affect an operation of the second comparator CMP2 or an output of the second comparator CMP2 may not affect an operation of the first comparator CMP1. Accordingly, the first comparator CMP1 and the second comparator CMP2 may operate independently of each other. For example, when the bias voltage $V_{BIAS}$ is lower than the reference voltage $V_{REF}$, the first comparator CMP1 may not normally operate, but the second comparator CMP2 may normally operate depending on a level of the input voltage $V_{IN}$ to turn on the output switch SW.

FIG. 8 is a diagram illustrating an operation of the discharge circuit according to an example embodiment illustrated in FIG. 7.

FIG. 8 may be a truth table for describing an operation of the discharge circuit 300 according to an example embodiment illustrated in FIG. 7. Referring to FIGS. 7 and 8 together, the first comparison signal $V_{OUT1}$, the second comparison signal $V_{OUT2}$, and the discharge control signal may be determined by the internal voltages $V_{IN}$, $V_{BIAS}$, and $V_{EN}$ received from the power supply circuit by the distribution circuit.

Referring to FIG. 8, the first comparison signal $V_{OUT1}$ may have a high level H when the enable voltage $V_{EN}$ is lower than the reference voltage $V_{REF}$ and the second comparison signal $V_{OUT2}$ may have a high level H when the bias voltage $V_{BIAS}$ is lower than the reference voltage $V_{REF}$. Accordingly, when at least one of the enable voltage $V_{EN}$ and the bias voltage VBIAS is lower than the reference voltage $V_{REF}$, the OR gate "OR" may output a discharge control signal having a high level H to turn on the output switch SW and to rapidly discharge the operating voltage $V_{OP}$. Meanwhile, when both the enable voltage $V_{EN}$ and the bias voltage $V_{BIAS}$ are higher than the reference voltage $V_{REF}$, the OR gate "OR" may output a discharge control signal having a low level L to turn off the output switch SW and may control the operating voltage $V_{OP}$ such that the operating voltage $V_{OP}$ is provided to the controller and/or memory devices.

In summary, in the example embodiment illustrated in FIGS. 7 and 8, among the internal voltages $V_{IN}$, $V_{BIAS}$, and $V_{EN}$, two or more internal voltage may each be compared with the reference voltage $V_{REF}$ to control whether or not to turn on the output switch SW. Accordingly, an ability of the storage device to respond to a case in which the operating voltage VOP needs to be rapidly discharged may be improved and operational stability of the storage device may be improved.

However, in the example embodiment illustrated in FIG. 7, both the first comparator CMP1 and the second comparator CMP2 receive the internal voltages $V_{IN}$, $V_{BIAS}$, and $V_{EN}$ as power supply voltages, so that the operating voltage may not be turned on even when the operating voltage VOP needs to be discharged in a specific case. For example, when both the bias voltage $V_{BIAS}$, a power supply voltage of the first comparator CMP1, and the input voltage $V_{IN}$, a power supply voltage of the second comparator CMP2, are at a low level L lower than a level of the reference voltage $V_{REF}$, the first comparator CMP1 and the second comparator CMP2 may not operate. Accordingly, the output switch SW may not be turned on.

To secure an ability to respond to the above exceptional cases, in an example embodiment, an external voltage, rather than the internal voltages $V_{IN}$, $V_{BIAS}$, and $V_{EN}$, may be provided to at least one of the first comparator CMP1 and the second comparator CMP2 as a power supply voltage. Hereinafter, this will be described in greater detail with reference to FIGS. 9 and 10.

Figure 9:
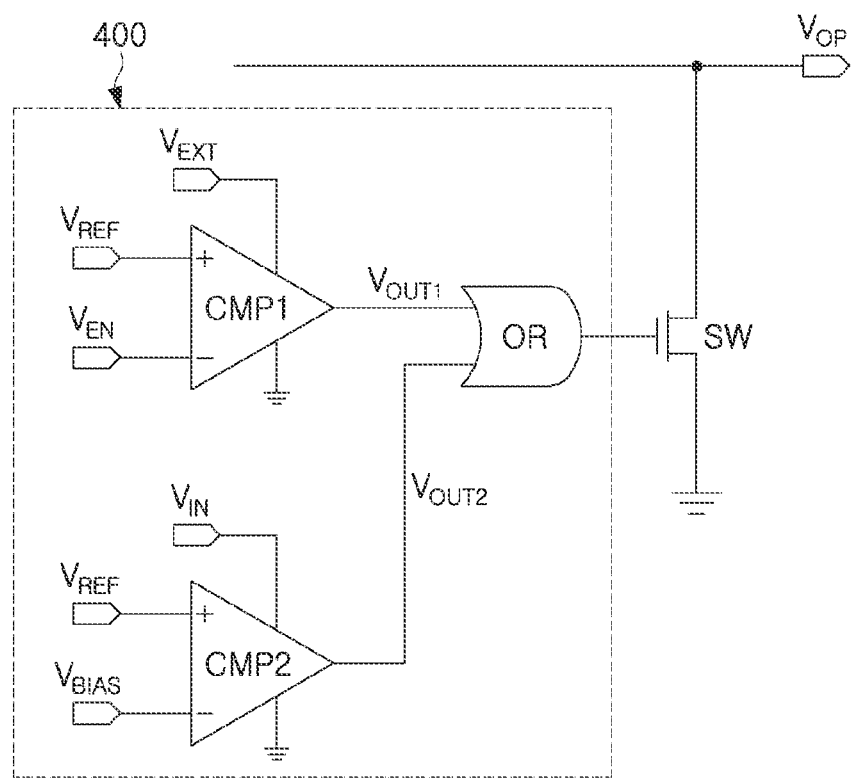
FIGS. 9 and 10 are diagrams illustrating a discharge circuit included in a storage device according to an example embodiment.
Figure 10:
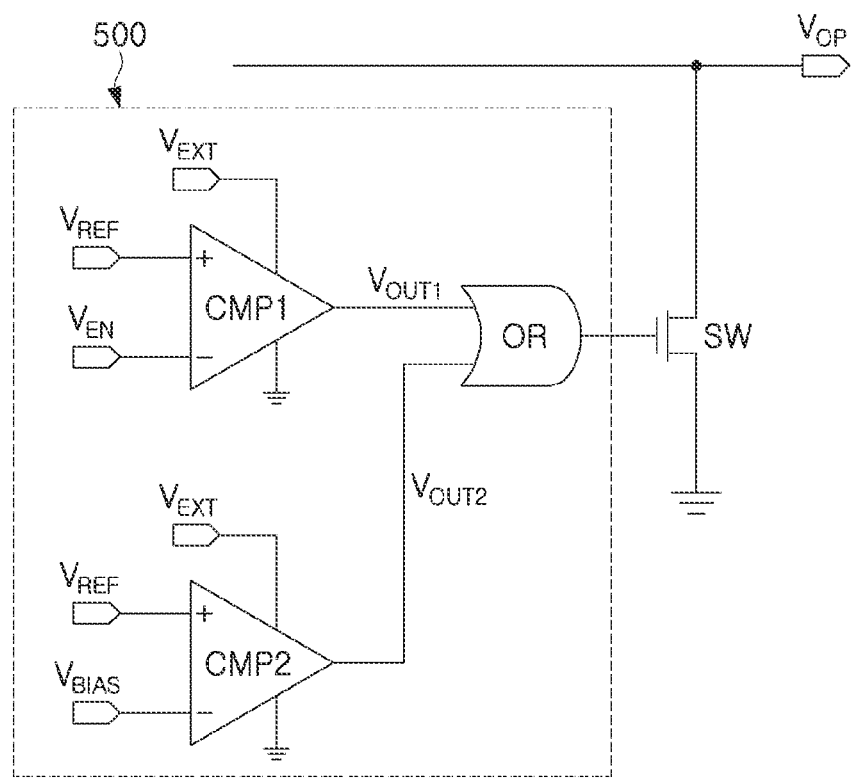

FIGS. 9 and 10 are diagrams illustrating a discharge circuit included in a storage device according to an example embodiment.

Referring to FIG. 9, a discharge circuit 400 according to an example embodiment may include a first comparator CMP1 and a second comparator CMP2.

The first comparator CMP1 may compare an enable voltage $V_{EN}$, corresponding to a first internal voltage, with the reference voltage $V_{REF}$. The second comparator CMP2 may compare a bias voltage $V_{BIAS}$, corresponding to a second internal voltage, with the reference voltage $V_{REF}$. Each of the first comparator CMP1 and the second comparator CMP2 may receive the reference voltage $V_{REF}$ through a non-inverting input terminal thereof.

Unlike the discharging circuit 300 according to an example embodiment described above with reference to FIG. 7, in the example embodiment illustrated in FIG. 9, the first comparator CMP1 may receive an external voltage $V_{EXT}$ as a power supply voltage and the second comparator CMP2 may receive an input voltage $V_{IN}$, a third internal voltage different from the first internal voltage and the second internal voltage, as a power supply voltage. Accordingly, even when both the enable voltage $V_{EN}$ and the bias voltage $V_{BIAS}$ are decreased to lower than or equal to the reference voltage $V_{REF}$, the first comparator CMP1 and the second comparator CMP2 may output a first comparison signal $V_{OUT1}$ and a second comparison signal $V_{OUT2}$ and an output switch SW may be turned on by an OR gate "OR."

Referring to FIG. 10, a discharge circuit 500 according to an example embodiment may include a first comparator CMP1 and a second comparator CMP2. The first comparator CMP1 may compare an enable voltage $V_{EN}$, corresponding to a first internal voltage, with the reference voltage $V_{REF}$. The second comparator CMP2 may compare a bias voltage $V_{BIAS}$, corresponding to a second internal voltage, with the reference voltage $V_{REF}$.

In the example embodiment illustrated in FIG. 10, both the first comparator CMP1 and the second comparator CMP2 may receive an external voltage VEXT as the power supply voltage. Accordingly, even when internal voltages $V_{EN}$, $V_{BIAS}$, and $V_{IN}$ output from a power supply circuit are decreased to be lower than or equal to the reference voltage $V_{REF}$, the first comparator CMP1 and the second comparator CMP2 may continuously operate and may turn on an output switch SW to rapidly discharge an operating voltage $V_{OP}$.

In the example embodiments described with reference to FIGS. 9 and 10, an electronic device such as a storage device including a power supply circuit, a distribution circuit, and discharge circuits 400 and 500 may use an externally provided voltage as an external voltage $V_{EXT}$ as it is. Alternatively, a level of the externally provided voltage may be decreased by a voltage divider including a resistor to generate an external voltage $V_{EXT}$.

In the example embodiments described with reference to FIGS. 9 and 10, the first comparator CMP1 and the second comparator CMP2 may operate independently of each other. For example, an output of the first comparator CMP1 may be determined by the enable voltage $V_{EN}$ and an output of the second comparator CMP2 may be determined by the bias voltage $V_{BIAS}$. For example, the output of the first comparator CMP1 may not affect an operation of the second comparator CMP2 or an output of the second comparator CMP2 may not affect an operation of the first comparator CMP1.

FIG. 11 is a diagram illustrating an operation of the discharge circuit according to an example embodiment illustrated in FIG. 10.

In the example embodiment described with reference to FIG. 10, both the first comparator CMP1 and the second comparator CMP2 may receive the external voltage $V_{EXT}$ as a power supply voltage. Accordingly, as illustrated in a truth table of FIG. 11, a first comparison signal VOUT1 output from the first comparator CMP1 may be determined by only the enable voltage $V_{EN}$, a first internal voltage, and the second comparison signal VOUT2 output from the second comparator CMP2 may be determined by only the bias voltage $V_{BIAS}$, a second internal voltage.

For example, when the bias voltage $V_{BIAS}$ is lower than the reference voltage $V_{REF}$ and the enable voltage $V_{EN}$ is higher than the reference voltage $V_{REF}$, the output switch SW may not be turned on in the example embodiment described above with reference to FIG. 8. Meanwhile, in the example embodiment illustrated in FIG. 11, the second comparator CMP2 may output a second comparison signal $V_{OUT2}$ having a high level H under the same condition. Accordingly, the output switch SW may be turned on and the operating voltage $V_{OP}$ may be rapidly discharged.

As described above, in an example embodiment, the external voltage $V_{EXT}$ may be provided to at least one of the first comparator CMP1 and the second comparator CMP2 as a power supply voltage to improve the operational stability of the discharging circuits 300 and 400. In addition, in an example embodiment, three or more comparators may be included in the discharge circuit to further improve performance of the discharge circuit. Hereinafter, this will be described in more detail with reference to FIG. 12.

Figure 12:
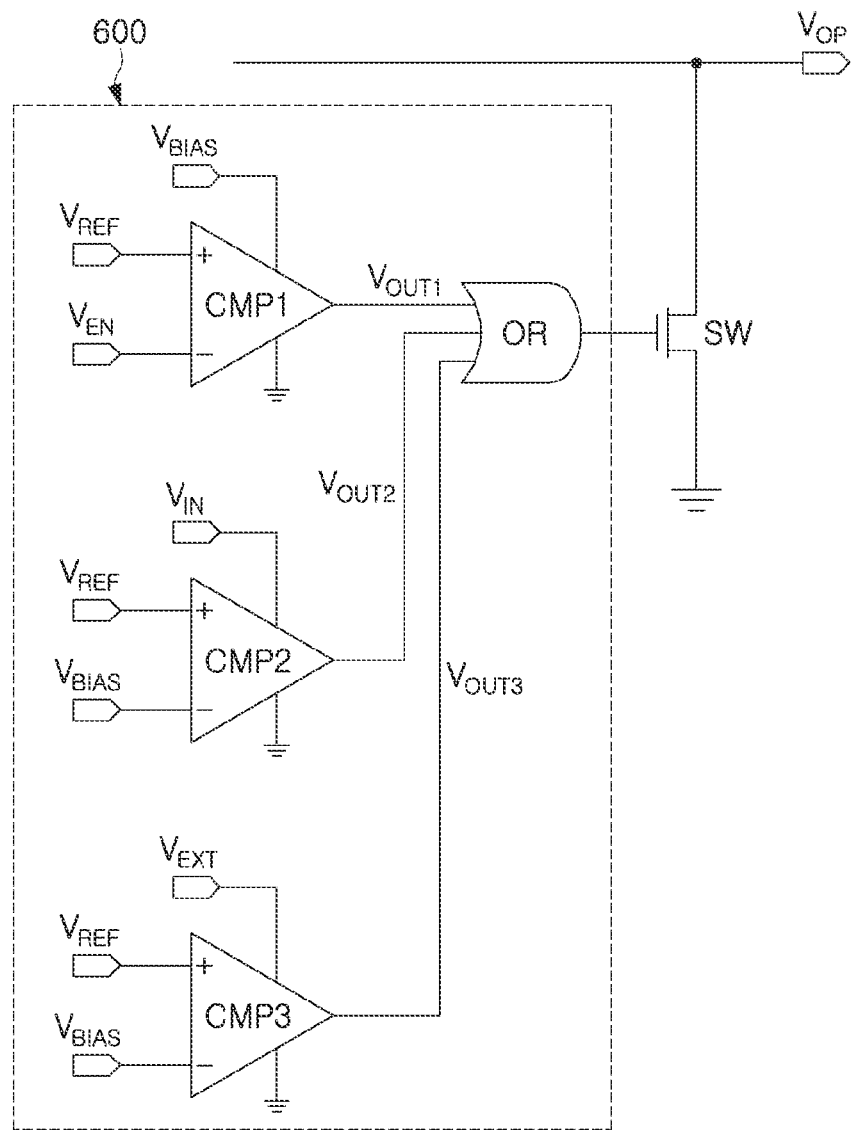
FIG. 12 is a diagram illustrating a discharge circuit included in a storage device according to an example embodiment.

FIG. 12 is a diagram illustrating a discharge circuit included in a storage device according to an example embodiment.

Referring to FIG. 12, the discharge circuit 600 according to an example embodiment may include first to third comparators CMP1, CMP2, and CMP3. The first comparator CMP1 may compare an enable voltage $V_{EN}$ with a reference voltage $V_{REF}$ and may operate with a bias voltage $V_{BIAS}$ as a power supply voltage. Each of the second comparator CMP2 and the third comparator CMP3 may compare the bias voltage $V_{BIAS}$ with the reference voltage $V_{REF}$. The second comparator CMP2 may operate with an input voltage $V_{IN}$ as a power supply voltage, and the third comparator CMP3 may operate with an external voltage $V_{EXT}$ as a power supply voltage.

The first to third comparison signals $V_{OUT1}$, $V_{OUT2}$, and $V_{OUT3}$, output by the first to third comparators CMP1, CMP2, and CMP3, may be input to an OR gate "OR," and a control terminal of the output switch SW may be connected to an output terminal of the OR gate "OR." Accordingly, when at least one of the first to third comparison signals $V_{OUT1}$, $V_{OUT2}$, and $V_{OUT3}$ is at a high level H, the output switch SW may be turned on and an operating voltage $V_{OP}$ may be connected to a ground terminal to be rapidly discharged.

Figure 13:
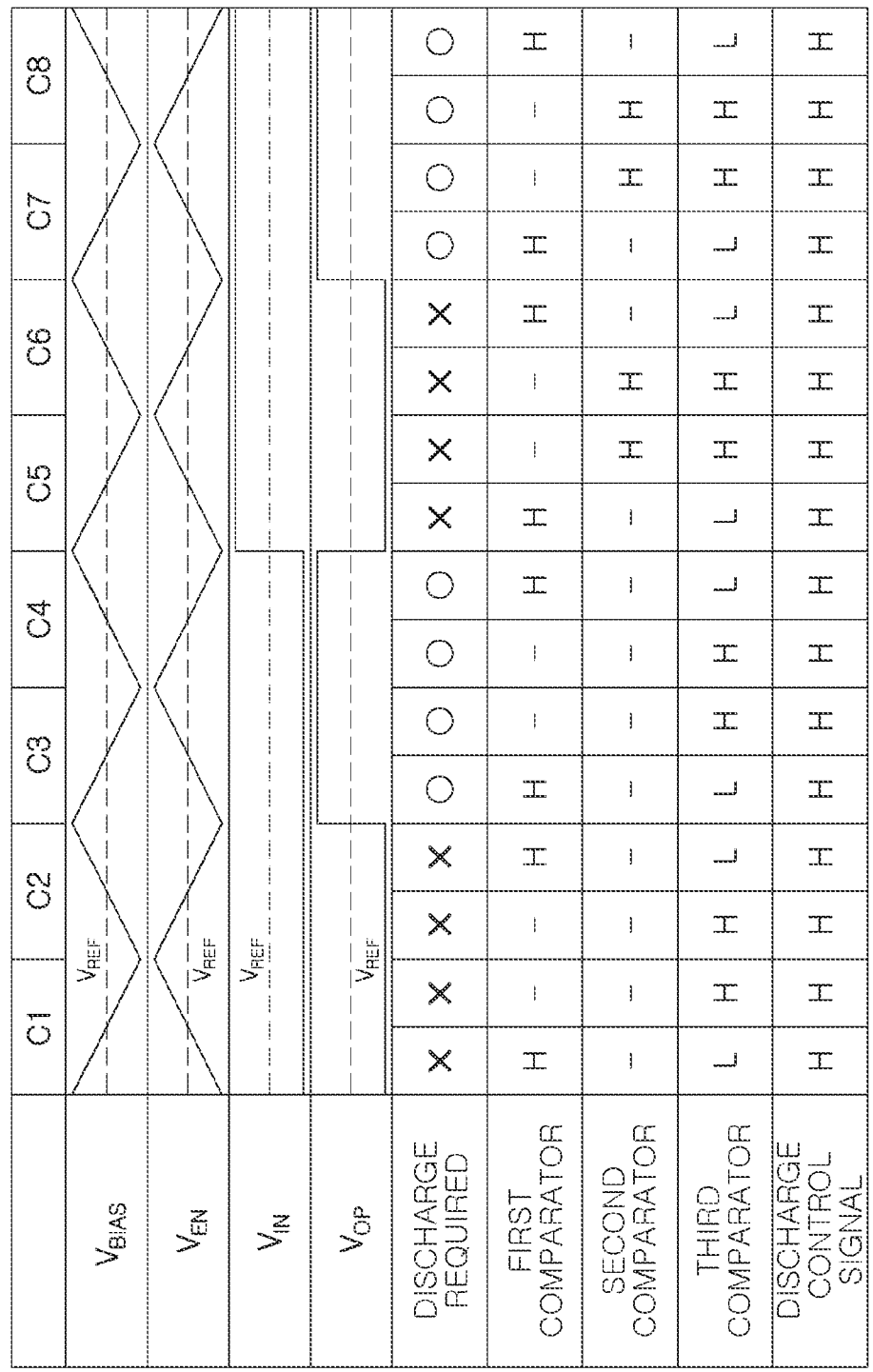
Figure 14:
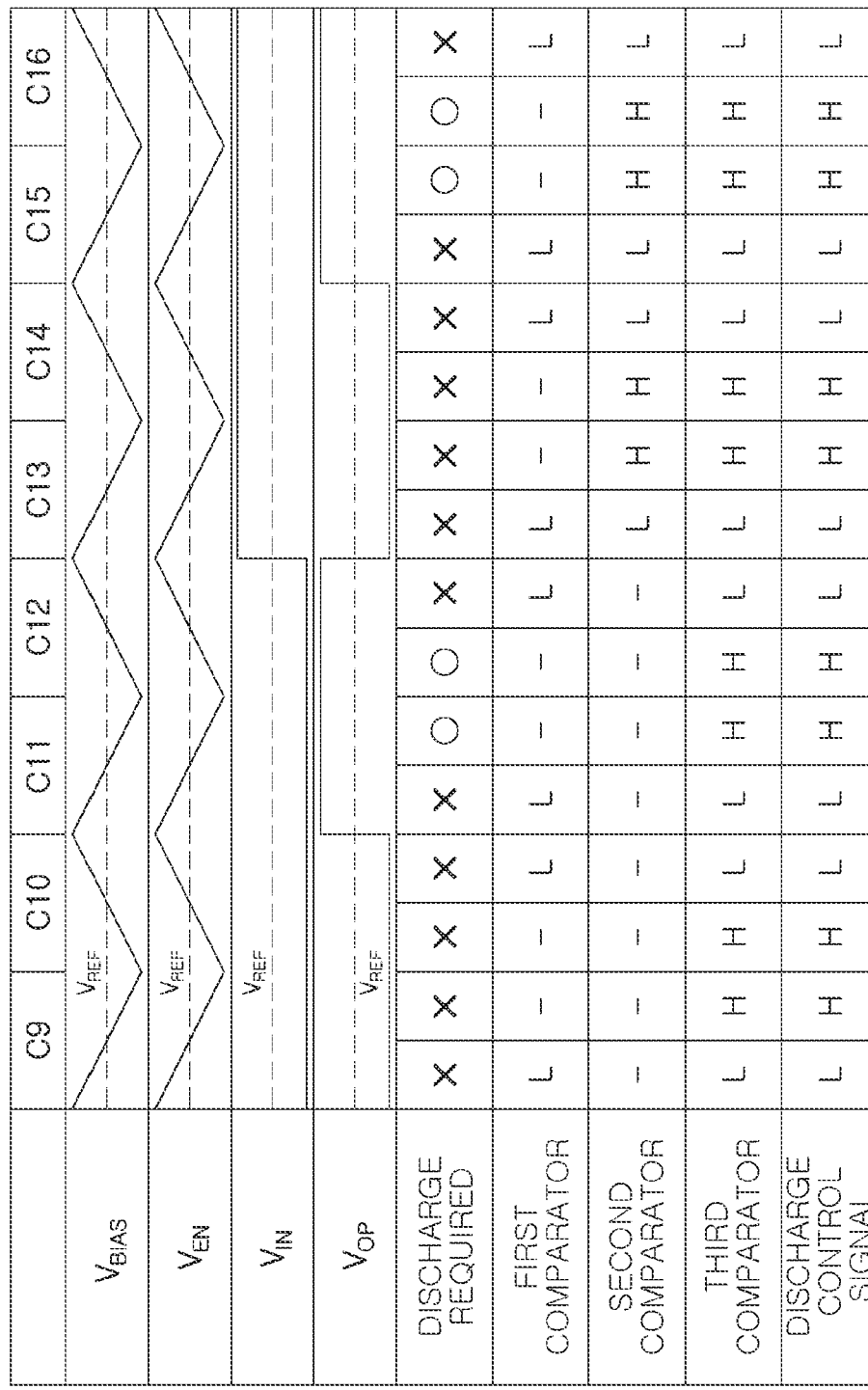

FIGS. 13 to 15 are diagrams illustrating an operation of the discharge circuit according to an example embodiment illustrated in FIG. 12.

FIGS. 13 to 15 are diagrams illustrating an operation of the discharge circuit 600 in various cases C1 to C32. Among the cases C1 to C32 illustrated in FIGS. 13 to 15, cases in which discharging is not required may be cases in which both an enable voltage $V_{EN}$ and a bias voltage $V_{BIAS}$ output from a power supply circuit are higher than or equal to a reference voltage $V_{REF}$, or cases in which an operating voltage $V_{OP}$ is already at a ground voltage level. For example, in the first case C1 and the second case C2, at least one of the internal voltages $V_{EN}$, $V_{BIAS}$, and $V_N$ is lower than the reference voltage $V_{REF}$ but the operating voltage VOP has a ground level, so that discharging performed by the discharge circuit 600 may not be required.

As described above with reference to FIG. 12, in the discharge circuit 600, each of the first to third comparators CMP1, CMP2, and CMP3 may operate with different voltages as power supply voltages. Accordingly, in cases in which discharging is required, at least one of the first to third comparison signals $V_{OUT1}$, $V_{OUT2}$, and $V_{OUT3}$ may have a high level and the OR gate "OR" turns on the output switch SW to discharge the operating voltage $V_{OP}$.

As an example, referring to the eleventh case C11 and the twelfth case C12, both an enable voltage $V_{EN}$ and a bias voltage $V_{BIAS}$ are decreased to be lower than or equal to a reference voltage $V_{REF}$, while an operating voltage VOP is greater than the reference voltage $V_{REF}$, so that the discharge circuit 600 may have to operate. As illustrated in FIG. 14, in the eleventh case C11 and the twelfth case C12, both an input voltage $V_{IN}$ and a bias voltage $V_{BIAS}$ are lower than or equal to a reference voltage $V_{REF}$, so that a first comparator CMP1 and a second comparator CMP2 may not normally operate. Accordingly, the first comparison signal VOUT1 and the second comparison signal VOUT2 may not be output or may be output at a low level L.

In the discharge circuit 600 according to the example embodiment illustrated in FIG. 12, the third comparator CMP3 may operate with the external voltage VEXT. Therefore, the third comparator CMP3 may normally operate in the eleventh case C11 and the twelfth case C12. Accordingly, in each of the eleventh and twelfth cases C11 and C12, the output switch SW may be turned on and the operating voltage $V_{OP}$ may be rapidly discharged by the third comparator CMP3 outputting a third comparison signal $V_{OUT3}$ having a high level H.

On the other hand, in cases 29 and 31 in which only an enable voltage $V_{EN}$ is decreased to be lower than a reference voltage $V_{REF}$, a second comparator CMP2 and a third comparator CMP3 may output a second comparison signal $V_{OUT2}$ and a third comparison signal $V_{OUT3}$ having a low level L. However, in the example embodiment illustrated in FIG. 12, the discharge control signal output from the OR gate "OR" may have a high level H and the output switch SW may be turned on by the first comparator CMP1 comparing the enable signal $V_{EN}$ with the reference signal $V_{REF}$.

Figure 16:
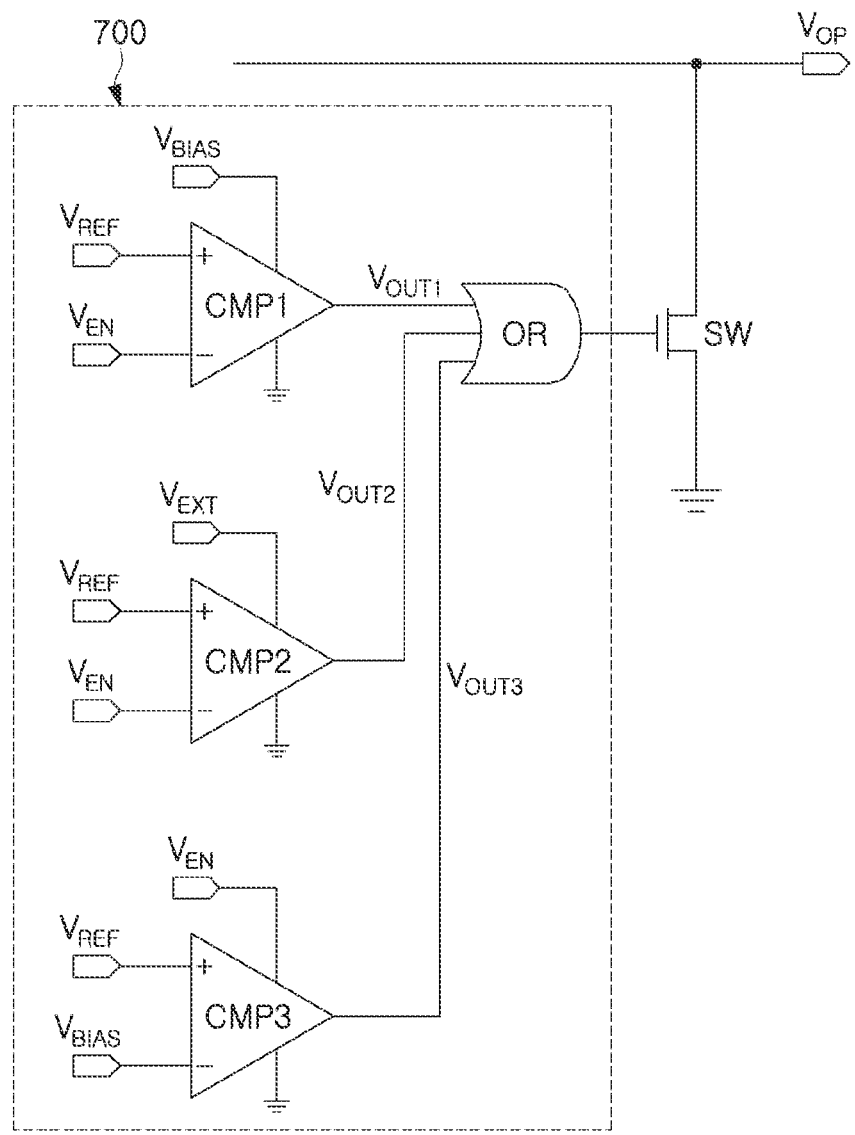
FIG. 16 is a diagram illustrating a discharge circuit included in a storage device according to an example embodiment.

FIG. 16 is a diagram illustrating a discharge circuit included in a storage device according to an example embodiment.

The discharge circuit 700 according to an example embodiment illustrated in FIG. 16 may include first to third comparators CMP1, CMP2, and CMP3. Each of the first comparator CMP1 and the second comparator CMP2 may compare the enable voltage $V_{EN}$ with the reference voltage $V_{REF}$, and the third comparator CMP3 may compare the bias voltage $V_{BIAS}$ with the reference voltage $V_{REF}$. The first comparator CMP1 may receive the bias voltage $V_{BIAS}$ as a power supply voltage, and the second comparator CMP2 may receive the external voltage $V_{EXT}$ as a power supply voltage. The third comparator CMP3 may receive the enable voltage $V_{EN}$ as a power supply voltage. The OR gate "OR" may perform an OR operation on the first to third comparison signals $V_{OUT1}$, $V_{OUT2}$ and $V_{OUT3}$ output by the first to third comparators CMP1, CMP2, and CMP3 to turn on and off the output switch SW.

FIGS. 17 to 19 are diagrams illustrating an operation of the discharge circuit according to an example embodiment illustrated in FIG. 16.

FIGS. 17 to 19 are diagrams illustrating operations of the discharge circuit 700 in various cases C1 to C32. In the cases C1 to C32 illustrated in FIGS. 17 to 19, conditions of the internal voltages $V_{EN}$, $V_{BIAS}$, and $V_N$ and the operating voltage $V_{OP}$ may be the same as those of the above cases C1 to C32 illustrated in FIGS. 13 to 15. However, the first to third comparators CMP1, CMP2 and CMP3 are configured to be different from each other, so that the first to third comparison signals $V_{OUT1}$, $V_{OUT2}$, and $V_{OUT3}$ output by the first to third comparators CMP1, CMP2 and CMP3 may be different from those in the cases C1 to C32 described with reference to FIGS. 13 to 15.

For example, referring to the eleventh case C11 and the twelfth case C12, in the example embodiment described above with reference to FIG. 14, as the enable voltage $V_{EN}$ and the bias voltage $V_{BIAS}$ are decreased to be lower than or equal to the reference voltages $V_{REF}$, only the third comparison signal $V_{OUT3}$ output from the third comparator CMP3 may have a high level H. On the other hand, in the example embodiment illustrated in FIG. 18, the discharge control signal may have a high level H and the output switch SW may be turned on by the second comparison signal $V_{OUT2}$ output by the second comparator CMP2.

In the example embodiment illustrated in FIG. 16, in the eleventh case C11 and the twelfth case C12, the first comparator CMP1 and the third comparator CMP3 may not normally operate, whereas the second comparator CMP2 receiving the external voltage $V_{EXT}$ as a power supply voltage may output the second comparison signal $V_{OUT2}$ having a high level H.

In the discharge circuit 700 according to the example embodiment illustrated in FIG. 16, when the bias voltage $V_{BIAS}$ is decreased to be lower than or equal to the reference voltage $V_{REF}$, the output switch SW may be turned off by the third comparator CMP3. However, since the third comparator CMP3 receives the enable voltage $V_{EN}$ as the power supply voltage, the third comparator CMP3 may not normally operate when the enable voltage $V_{EN}$ is decreased to be lower than or equal to the reference voltage $V_{REF}$. In this case, in the discharge circuit 700, the second comparator CMP2 may output the second comparison signal $V_{OUT2}$ having a high level H to turn on the output switch SW and to discharge the operating voltage $V_{OP}$.

Figure 20:
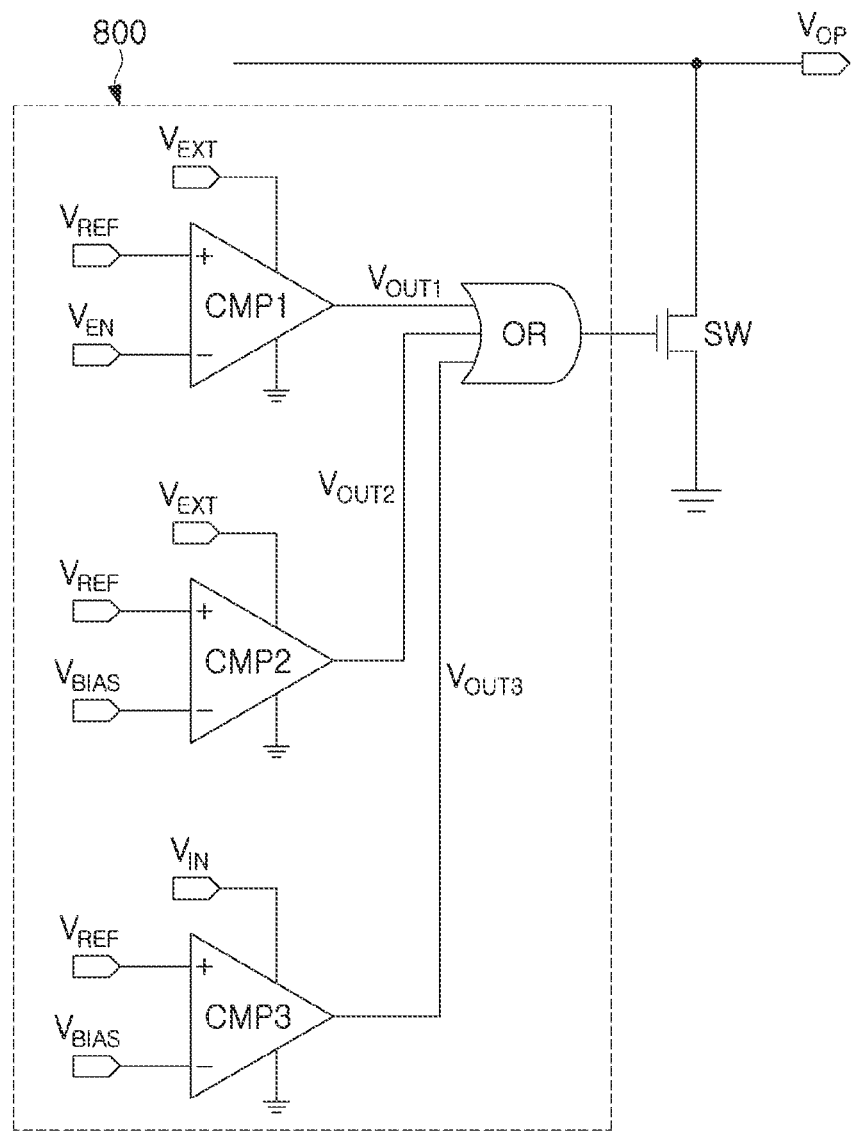
FIG. 20 is a diagram illustrating a discharge circuit included in a storage device according to an example embodiment.

FIG. 20 is a diagram illustrating a discharge circuit included in a storage device according to an example embodiment.

Referring to FIG. 20, a discharge circuit 800 according to an example embodiment may include first to third comparators CMP1, CMP2, and CMP3. Each of the first comparator CMP1 and the second comparator CMP2 may receive an external voltage $V_{EXT}$ as a power supply voltage, and the third comparator CMP3 may receive an input voltage $V_{IN}$ as a power supply voltage. The first comparator CMP1 may compare an enable voltage $V_{EN}$ with a reference voltage $V_{REF}$, and each of the second comparator CMP2 and the third comparator CMP3 may compare a bias voltage $V_{BIAS}$ with the reference voltage $V_{REF}$. The OR gate "OR" may perform an OR operation on first to third comparison signals $V_{OUT1}$, $V_{OUT2}$, and $V_{OUT3}$, output from the first to third comparators CMP1, CMP2, and CMP3, to turn on and off the output switch SW.

In the discharge circuit 700 according to an example embodiment illustrated in FIG. 16, when the bias voltage $V_{BIAS}$ is decreased to be lower than or equal to the reference voltage $V_{REF}$, the output switch SW may be turned off by the third comparator CMP3. In addition, when the enable voltage $V_{EN}$ is decreased to be lower than or equal to the reference voltage $V_{REF}$, the output switch SW may be turned off by the first comparator CMP1 or the second comparator CMP2. In addition, the external voltage $V_{EXT}$ may be applied to the second comparator CMP2 as a power supply voltage, so the discharge circuit 800 may stably operate.

Figure 21:
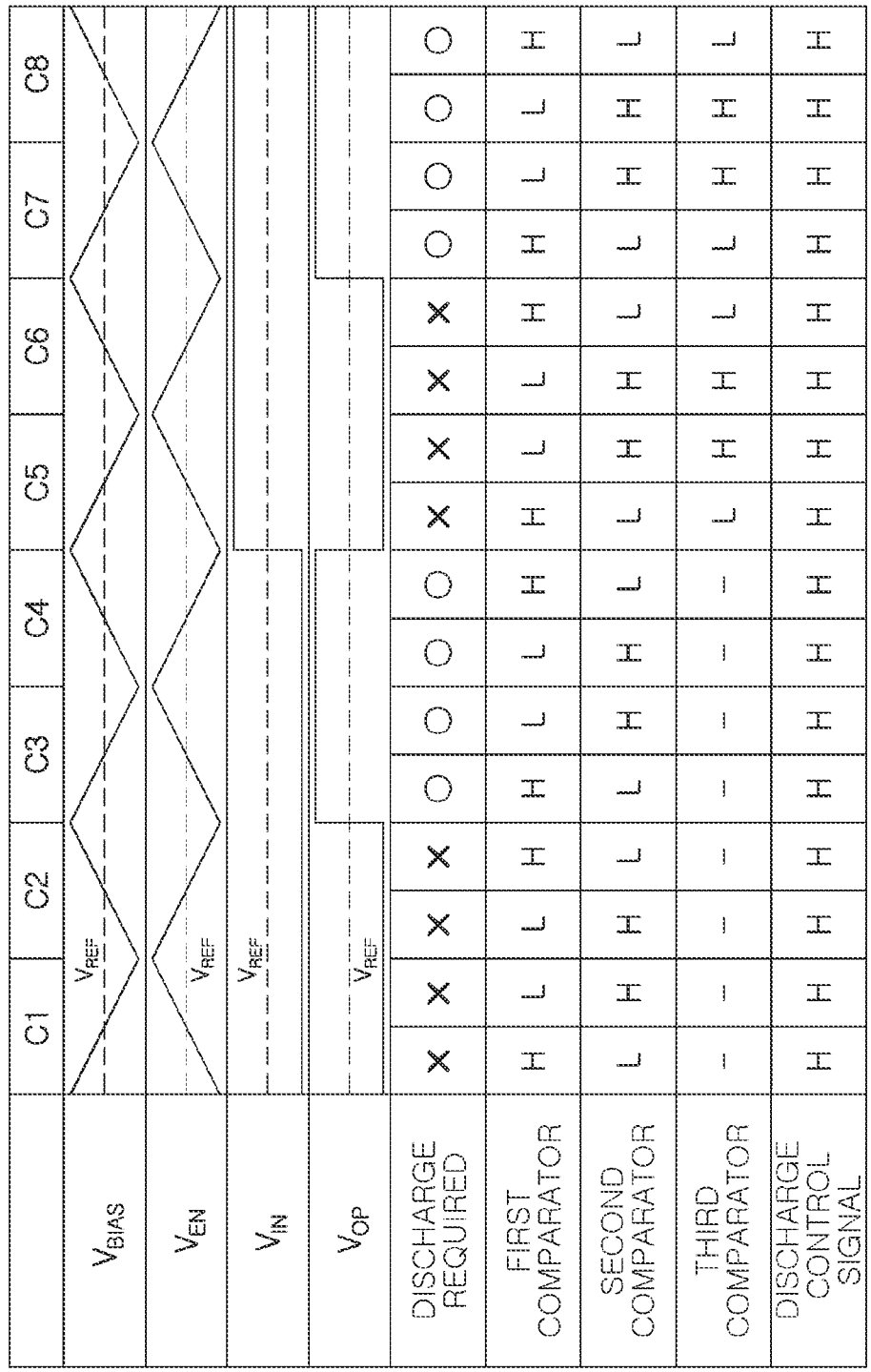

FIGS. 21 to 23 are diagrams illustrating an operation of the discharge circuit according to an example embodiment illustrated in FIG. 20.

FIGS. 21 to 23 are diagrams illustrating operations of the discharge circuit 700 in various cases C1 to C32. Voltage conditions in each of the cases C1 to C32, illustrated in FIGS. 21 to 23, may be the same as those in the cases C1 to C32 illustrated in FIGS. 13 to 15 and FIGS. 17 to 19.

Referring to the twenty-third case C23 in the example embodiment illustrated in FIG. 19, as the enable voltage $V_{EN}$ and the bias voltage $V_{BIAS}$ are decreased to be lower than or equal to the reference voltage $V_{REF}$, only the second comparison signal $V_{OUT2}$ output by the second comparator CMP2 may have a high level H. This is because the bias voltage $V_{BIAS}$ and the enable voltage $V_{EN}$ are respectively provided to the first comparator CMP1 and the third comparator CMP3 as power voltages to prevent the first comparator CMP1 and the third comparator CMP3 from normally outputting the first and third comparison signals $V_{OUT1}$ and $V_{OUT3}$.

On the other hand, referring to the twenty-third case C23 in the example embodiment illustrated in FIG. 23, the enable voltage $V_{EN}$ and the bias voltage $V_{BIAS}$ are lower than the reference voltage $V_{REF}$, whereas the input voltage $V_{IN}$ is higher than the reference voltage $V_{REF}$. Accordingly, the first to third comparators CMP1, CMP2, and CMP3 may all output the first to third comparison signals VOUT1, VOUT2, and VOUT3 having a high level H.

Referring to the twentieth case C20 in the example embodiment illustrated in FIG. 15, as the bias voltage $V_{BIAS}$ is decreased to be lower than or equal to the reference voltage $V_{REF}$, only the third comparison signal $V_{OUT3}$ outputted by the third comparator CMP3 may have a high level H. This is because the first comparator CMP1 compares the reference voltage $V_{REF}$ with the enable voltage $V_{EN}$ and receives the bias voltage $V_{BIAS}$ as a power supply voltage and the second comparator CMP2 receives an input voltage $V_{IN}$, lower than the reference voltage $V_{REF}$, as a power supply voltage.

In the twentieth case C20 of the embodiment illustrated in FIG. 23, the discharge control signal may have a high level H and the output switch SW may be turned on by the second comparison signal $V_{OUT2}$ output from the second comparator CMP2. As described above with reference to FIG. 20, the first comparator CMP1 may compare the enable voltage $V_{EN}$ with the reference voltage $V_{REF}$, so that the first comparison signal $V_{OUT1}$ may have a low level L. Since the third comparator CMP3 operates with receiving the input voltage $V_{IN}$ as a power supply voltage, the third comparator CMP3 may not normally operate in the twentieth case C20.

As described above, the electronic device according to an example embodiment may include a power supply circuit, a distribution circuit, and a plurality of semiconductor devices, and the plurality of semiconductor devices may operate with an operating voltage generated by the power supply circuit and divided by the distribution circuit. When the electronic device is a storage device, the plurality of semiconductor devices may include a controller, a memory device, and the like.

The distribution circuit may include a discharge circuit for rapidly discharging an operating voltage under a specific condition, but the discharge circuit included in the distribution circuit may include only a single comparator, and thus, may not operate when discharging is required. In an example embodiment, an additional discharge circuit, other than the distribution circuit, may be further connected between the power supply circuit and the plurality of semiconductor devices to rapidly discharge the operating voltage under a specific condition and to improve operational stability of the electronic device. The discharge circuit may include two or more comparators, and the comparators may operate with different power supply voltages. In some embodiments, at least one of the power voltages provided to the comparators may be an external voltage. In addition, in an example embodiment, the discharge circuit may include three or more comparators. In this case, the discharge circuit may discharge the operating voltage under more various conditions to further improve the stability of the electronic device.

Figure 24:
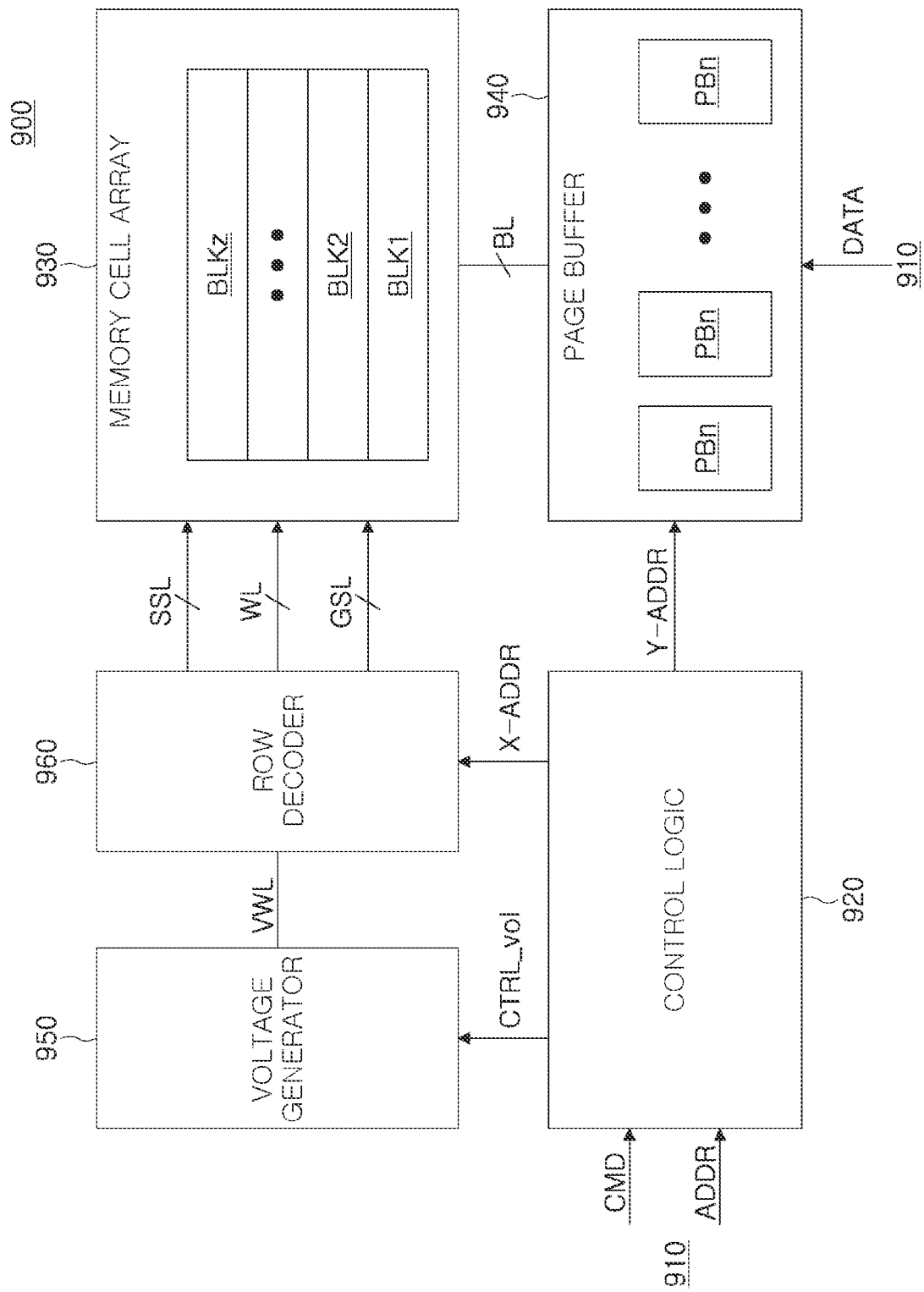
FIGS. 24 and 25 are diagrams illustrating a memory device included in a storage device according to an example embodiment.
Figure 25:
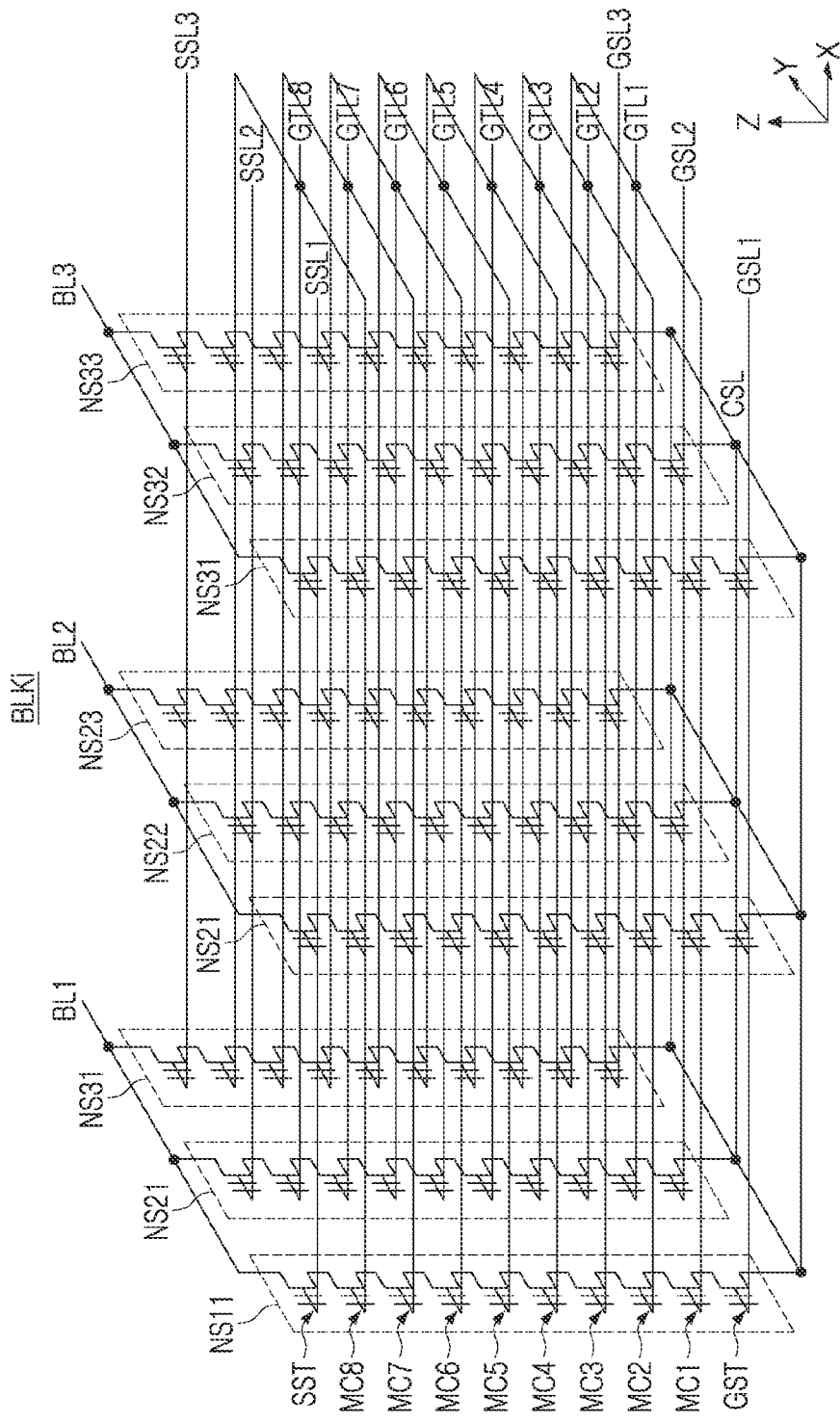

FIGS. 24 and 25 are diagrams illustrating a memory device included in a storage device according to an example embodiment.

FIG. 24 illustrates a block diagram illustrating an example of a memory device. Referring to FIG. 24, a memory device 900 may include a control logic circuit 920, a memory cell array 930, a page buffer 940, a voltage generator 950, and a row decoder 960. Although not illustrated in FIG. 24, the memory device 900 may further include the memory interface circuit 910 identified in FIG. 24 and may further include column logic, a pre-decoder, a temperature sensor, a command decoder, an address decoder, and the like.

The control logic circuit 920 may control the overall operation of the memory device 900. The control logic circuit 920 may output various control signals in response to a command CMD and/or an address ADDR from the memory interface circuit 910. For example, the control logic circuit 920 may output a voltage control signal CTRL_vol, a row address X-ADDR, and a column address Y-ADDR.

The memory cell array 930 may include a plurality of memory blocks BLK1 to BLKz (where z is a positive integer), and each of the plurality of memory blocks BLK1 to BLKz may include a plurality of memory cells. The memory cell array 930 may be connected to the page buffer unit 940 through bitlines BL and may be connected to the row decoder 960 through wordlines WL, string select lines SSL, and ground select lines GSL.

In an example embodiment, the memory cell array 930 may include a three-dimensional (3D) memory cell array and the 3D memory cell array may include a plurality of NAND strings. Each of the NAND strings may include memory cells, respectively connected to wordlines vertically stacked on a substrate. U.S. Pat. Nos. 7,679,133, 8,553,466, 8,654,587, 8,559,235, and U.S. Patent Application No. 2011/0233648 are incorporated herein by reference in their entirety. In an example embodiment, the memory cell array 930 may include a two-dimensional memory cell array and the two-dimensional memory cell array may include a plurality of NAND strings disposed in row and column directions.

As an example, when the memory cell array 930 includes a 3D memory cell array, each of the memory blocks BLK1 to BLKz may be represented by an equivalent circuit diagram as illustrated in FIG. 25. Referring to FIG. 25, a plurality of memory NAND strings included in a memory block BLKi may be formed in a direction perpendicular to the substrate.

Referring to FIG. 25, the memory block BLKi may include a plurality of memory NAND strings NS11 to NS33 connected between bitlines BL1, BL2, and BL3 and a common source line CSL. Each of the plurality of memory NAND strings NS11 to NS33 may include a string select transistor SST, a plurality of memory cells MC1 to MC8, and a ground select transistor GST. In FIG. 8, each of the plurality of memory NAND strings NS11 to S33 is illustrated as including eight memory cells MC1 to MC8, but example embodiments are not limited thereto.

The string select transistor SST may be connected to corresponding string select lines SSL1, SSL2, and SSL3. The plurality of memory cells MC1 to MC8 may be connected to corresponding gate lines GTL1 to GTL8, respectively. The gate lines GTL1 to GTL8 may correspond to wordlines, and some of the gate lines GTL1 to GTL8 may correspond to dummy wordlines. The ground select transistor GST may be connected to corresponding ground select lines GSL1, GSL2, and GSL3. The string select transistor SST may be connected to corresponding bitlines BL1, BL2, and BL3, and the ground select transistor GST may be connected to the common source line CSL.

Wordlines of the same height (for example, WL1) may be commonly connected, and the ground selection lines GSL1, GSL2, and GSL3 and the string selection lines SSL1, SSL2, and SSL3 may be separated from each other. In FIG. 25, the memory block BLK is illustrated as being connected to eight gate lines GTL1 to GTL8 and three bitlines BL1, BL2, and BL3, but example embodiments not limited thereto.

Returning to FIG. 24, the page buffer 940 may include a plurality of page buffers PB1 to PBn (where n is an integer greater than or equal to 3), and the plurality of page buffers PB1 to PBn may be respectively connected to the memory cells through the bitlines BL. The page buffer 940 may select at least one of the bitlines BL in response to the column address Y-ADDR. The page buffer 940 may operate as a write driver or a sense amplifier, depending on an operation mode. For example, the page buffer 940 may apply a bitline voltage, corresponding to data to be programmed, to a selected bitline during a program operation. The page buffer 940 may sense a current or a voltage on the selected bitline to sense data, stored in a memory cell, during a read operation.

The row decoder 960 may select one of the plurality of wordlines WL in response to the row address X-ADDR and may select one of the plurality of string selection lines SSL. For example, the row decoder 960 may apply a program voltage and a program verify voltage to the selected wordline during a program operation and may apply a read voltage to the selected wordline during a read operation.

The voltage generator 950 may generate various voltages for performing program, read, and erase operations based on a voltage control signal CTRL_vol. For example, the voltage generator 950 may generate a program voltage, a read voltage, a program verify voltage, an erase voltage, and the like, as the wordline voltages VWL. The voltage generator 950 may generate various voltages using an operating voltage generated by a power supply circuit, included in the storage device together with the memory device 900, and provided through a distribution circuit.

When power received by the storage device from an external entity is cut off, the memory device 900 may operate with an unstable operating voltage to deteriorate stability unless the operating voltage provided to the memory device 900 by the distribution circuit is rapidly discharged. In an example embodiment, as described above, an additional discharge circuit, other than the distribution circuit, may be connected between the power supply circuit and the memory device 900 and the discharge circuit may monitor levels of internal voltages, generated by the power supply circuit, to rapidly discharge the operating voltage provided to the memory device 900, as necessary. Accordingly, operational stability of the memory device 900 may be improved.

The discharge circuit according to an example embodiment may be applied to various devices including a power supply circuit as well as a storage device. Hereinafter, this will be described with reference to FIG. 26.

Figure 26:
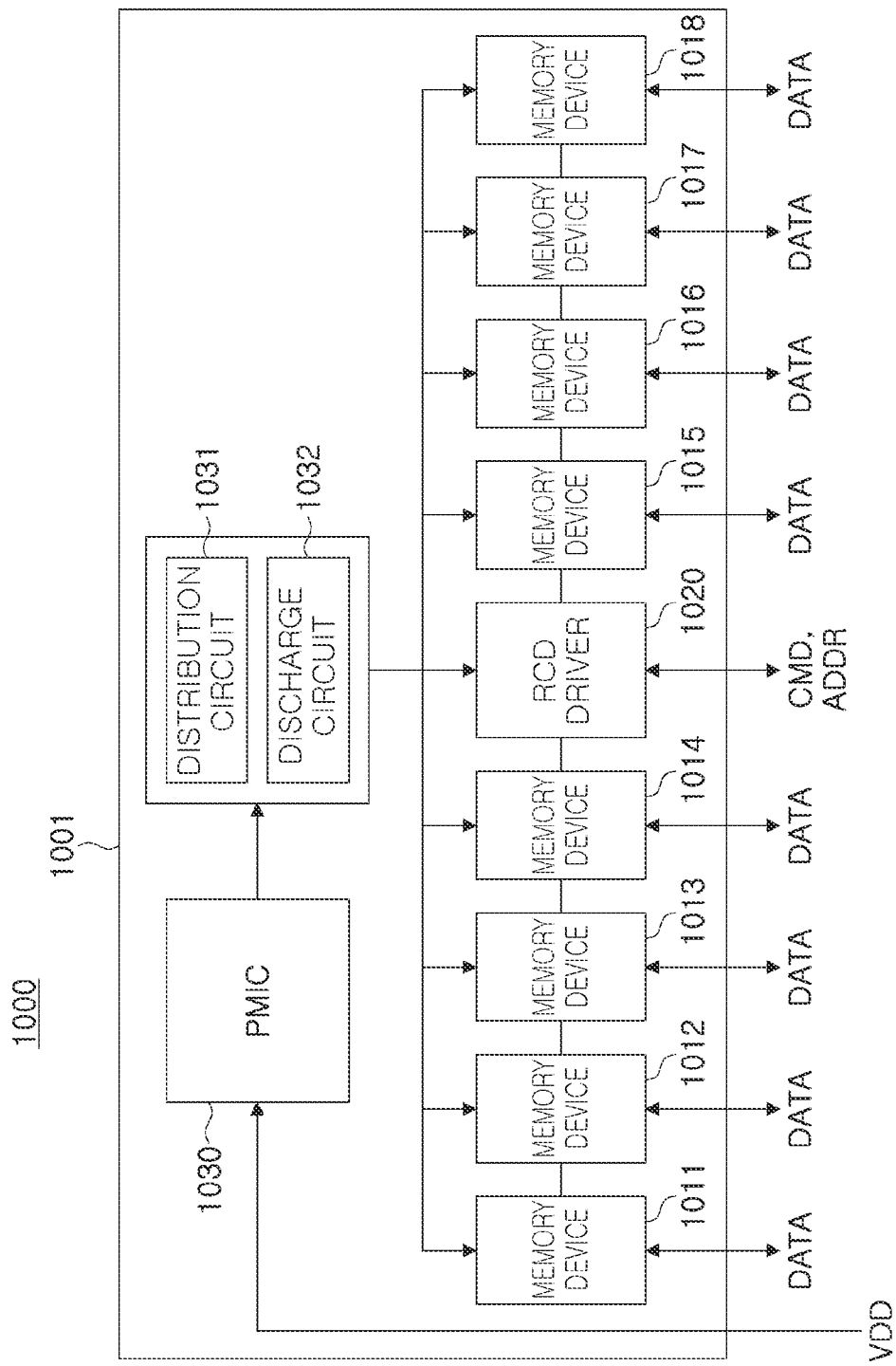
FIG. 26 is a schematic diagram illustrating a memory module including a discharge circuit according to an example embodiment.

FIG. 26 is a schematic diagram illustrating a memory module including a discharge circuit according to an example embodiment.

Referring to FIG. 26, a memory module 1000 according to an example embodiment may include a plurality of memory devices 1011 to 1018, a register clock driver 1020, a power supply circuit 1030, a distribution circuit 1031, a discharge circuit 1032, and the like. The plurality of memory devices 1011 to 1018, the register clock driver 1020, the power supply circuit 1030, the distribution circuit 1031, and the discharge circuit 1032 may be mounted on a module substrate 1001.

Each of the plurality of memory devices 1011 to 1018 may include a memory cell array, a row decoder, a column decoder, a sense amplifier, an input/output circuit, control logic, and the like. The memory cell array may include a plurality of memory banks, and each of the plurality of memory banks may include a plurality of memory cells connected to a plurality of wordlines and a plurality of bitlines. For example, each of the plurality of memory cells may include at least one switching device and at least one data storage device. In an example embodiment, the data storage device may include a capacitor, a variable resistance device, a magnetic memory device, and the like. Each of the plurality of memory devices 1011 to 1018 may transmit and receive data DATA to and from an external device through pads formed on the module substrate 1001.

The register clock driver 1020 may receive a command signal CMD and an address signal ADDR from an external device and may transmit the command signal CMD and the address signal ADDR to the plurality of memory devices 1011 to 1018. The power supply circuit 1030 may receive an external voltage VDD from an external device through a pad formed on the module substrate 1001. The power supply circuit 1030 may generate internal voltages, required to operate the plurality of memory devices 1011 to 1018 and the register clock driver 1020, using the external voltage VDD.

Internal voltages generated by the power supply circuit 1030 may be transmitted to the plurality of memory devices 1011 to 1018 and the register clock driver 1020 through the distribution circuit 1031. The distribution circuit 1031 may transmit the internal voltages to the plurality of memory devices 1011 to 1018 and the register clock driver 1020 as operating voltages. In the example embodiment illustrated in FIG. 26, together with the distribution circuit 1031, an additional discharge circuit 1032 may be connected to an output terminal of the power supply circuit 1030.

The discharge circuit 1032 may include a plurality of comparators, as described above. Each of the plurality of comparators included in the discharge circuit 1032 may compare one of the internal voltages, generated by the power supply circuit 1030, with a predetermined reference voltage. Also, the discharge circuit 1032 may compute output voltages of the plurality of comparators to determine whether the operating voltage, provided to the plurality of memory devices 1011 to 1018 and the register clock driver 1020, has been discharged. As an example, the discharge circuit 1032 may perform an OR operation on the output voltages of the plurality of comparators to determine whether the operating voltage is discharged.

As described above, an additional discharge circuit may be connected between at least one of a controller and a memory device and a power supply circuit. The discharge circuit may include two or more comparators operating with different power supply voltages. The power supply voltages provided to the comparators may be different from each other and may each be an internal voltage, output by the power supply circuit, or an external voltage received through an interface. Even when one of the comparators does not operate in a certain case, the other comparator may discharge the operating voltage, provided to the controller and the memory device by the power supply circuit, and may stably operate the storage device.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure. An aspect of an embodiment may be achieved through instructions stored within a non-transitory storage medium and executed by a processor.

While example embodiments have been shown and described above, it will be apparent to those skilled in the art that modifications and variations could be made without departing from the scope of the present disclosure as defined by the appended claims.

What is claimed is:

1. A storage device comprising:
    a controller configured to exchange data with an external host through an interface;
    a plurality of memory devices configured to store the data;
    a power supply circuit configured to output internal voltages, required for the controller and the plurality of memory devices, using an external voltage received through the interface;
    a distribution circuit connected between the controller and the power supply circuit and between the plurality of memory devices and the power supply circuit, and configured to provide an operating voltage to the plurality of memory devices; and
    a discharge circuit including:
        a first comparator configured to compare a first internal voltage, among the internal voltages, with a reference voltage,
        a second comparator configured to compare a second internal voltage, different from the first internal voltage, with the reference voltage, and
        an operational circuit configured to compute an output of the first comparator and an output of the second comparator to output a discharge control signal, wherein the operating voltage is discharged based on the discharge control signal,
    wherein a first power supply voltage input to the first comparator is a different value from a second power supply voltage input to the second comparator, and
    wherein the first power supply voltage and the second power supply voltage are selected from among the internal voltages.

2. The storage device of claim 1, wherein the first comparator, the second comparator, and the operational circuit are implemented as circuits, different from the distribution circuit.

3. The storage device of claim 1, wherein the first comparator is configured to operate with the second internal voltage and the second comparator is configured to operate with a third internal voltage, different from the first internal voltage and the second internal voltage, among the internal voltages.

4. The storage device of claim 1, wherein the first comparator is configured to operate with the external voltage.

5. The storage device of claim 4, wherein the second comparator is configured to operate with a third internal voltage, different from the first internal voltage and the second internal voltage, among the internal voltages.

6. The storage device of claim 4, wherein the second comparator is configured to operate with the external voltage.

7. The storage device of claim 1, wherein an output terminal of the operational circuit is connected to a control terminal of a switching device connected between an output node, which outputs the operating voltage, and a ground node receiving a power supply voltage.

8. The storage device of claim 1, wherein the operational circuit includes an OR gate that is configured to receive an output of the first comparator and an output of the second comparator.

9. A storage device comprising:
    a controller configured to exchange data with an external host through an interface;
    a plurality of memory devices configured to store the data;
    a power supply circuit configured to receive an external voltage from the external host through the interface and to output an operating voltage, required to operate the controller and the plurality of memory devices, and a plurality of internal voltages; and
    a discharge circuit connected between the power supply circuit and at least one of the controller and the plurality of memory devices and configured to output a discharge control signal that controls discharging of the operating voltage, wherein:
    the discharge circuit is configured to output the discharge control signal based on an output of each of a first comparator and a second comparator,
    the first comparator and the second comparator are configured to operate independently of each other, and
    the first comparator is configured to compare a first internal voltage, among the internal voltages, with a reference voltage and the second comparator is configured to compare a second internal voltage, different from the first internal voltage, with the reference voltage,
    wherein a first power supply voltage input to the first comparator is a different value from a second power supply voltage input to the second comparator, and
    wherein the first power supply voltage and the second power supply voltage are selected from among the internal voltages.

10. The storage device of claim 9, wherein the first power supply voltage is the second internal voltage.

11. The storage device of claim 9, wherein:
a first power supply voltage input to the first comparator is different from a second power supply voltage input to the second comparator,
the first power supply voltage is the external voltage, and
the second power supply voltage is selected from among the internal voltages.

12. The storage device of claim 9, wherein:
the discharge circuit further includes a third comparator configured to compare the first internal voltage or the second internal voltage with the reference voltage and configured to output the discharge control signal based on an output of each of the first comparator, the second comparator, and the third comparator, and
the third comparator is configured to operate independently of the first comparator and the second comparator.

13. The storage device of claim 12, wherein a third power supply voltage input to the third comparator is different from a first power supply voltage input to the first comparator and a second power supply voltage input to the second comparator.

14. The storage device of claim 13, wherein:
the first power supply voltage and the second power supply voltage are selected from among the internal voltages, and
the third power supply voltage is the external voltage.

15. The storage device of claim 13, wherein:
each of the first power supply voltage and the second power supply voltage is the external voltage, and
the third power supply voltage is selected from among the internal voltages.

16. An electronic device comprising:
a power supply circuit configured to receive an external voltage through an interface and to output a plurality of internal voltages using the external voltage;
a distribution circuit configured to transmit the plurality of internal voltages to a plurality of semiconductor devices; and
a discharge circuit connected between at least one of the plurality of semiconductor devices and the power supply circuit and including:
a first comparator configured to compare one of the plurality of internal voltages with a reference voltage to output a first comparison signal,
a second comparator configured to compare another one of the plurality of internal voltages with the reference voltage to output a second comparison signal, and
a logic circuit configured to perform an OR operation on the first comparison signal and the second comparison signal, wherein:
at least one of a first power supply voltage provided to the first comparator and a second power supply voltage provided to the second comparator is the external voltage or a voltage generated by dividing the external voltage,
a first power supply voltage input to the first comparator is a different value from a second power supply voltage input to the second comparator, and
the first power supply voltage and the second power supply voltage are selected from among the internal voltages.

17. The electronic device of claim 16, wherein the discharge circuit is configured to discharge a voltage output to the plurality of semiconductor devices by the distribution circuit when the one or the other one of the plurality of internal voltages is decreased to be lower than or equal to the reference voltage.

* * * * *